United States Patent
Lee et al.

(10) Patent No.: US 12,349,547 B2
(45) Date of Patent: Jul. 1, 2025

(54) ELECTROLUMINESCENT DISPLAY DEVICE

(71) Applicant: LG DISPLAY CO., LTD., Seoul (KR)

(72) Inventors: Sang-Bin Lee, Paju-si (KR); In-Sun Yoo, Paju-si (KR); Jeong-Mook Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 704 days.

(21) Appl. No.: 17/515,731

(22) Filed: Nov. 1, 2021

(65) Prior Publication Data

US 2022/0173180 A1    Jun. 2, 2022

(30) Foreign Application Priority Data

Dec. 2, 2020   (KR) ........................ 10-2020-0166767

(51) Int. Cl.
  *H01L 27/32*   (2006.01)
  *H10K 50/13*   (2023.01)
  *H10K 59/122*  (2023.01)
  *H10K 59/38*   (2023.01)

(52) U.S. Cl.
  CPC ......... *H10K 59/122* (2023.02); *H10K 50/131* (2023.02); *H10K 59/38* (2023.02)

(58) Field of Classification Search
  None
  See application file for complete search history.

(56) References Cited

U.S. PATENT DOCUMENTS

| | | | |
|---|---|---|---|
| 8,921,843 B2* | 12/2014 | Song | H10K 85/626 |
| | | | 257/89 |
| 10,418,580 B2 | 9/2019 | Heo et al. | |
| 10,629,663 B2* | 4/2020 | Jung | H10K 50/805 |
| | (Continued) | | |

FOREIGN PATENT DOCUMENTS

| | | |
|---|---|---|
| JP | 2004-205911 A | 7/2004 |
| KR | 10-2013-0063974 A | 6/2013 |
| | (Continued) | |

OTHER PUBLICATIONS

Office Action dated Jul. 25, 2024 issued in Korean Patent Application No. 10-2020-0166767.

*Primary Examiner* — Long Pham
(74) *Attorney, Agent, or Firm* — Morgan, Lewis & Bockius LLP

(57) ABSTRACT

An electroluminescent display device includes first and second substrates on which a pixel including first, second, and third sub-pixels are defined, a light-emitting diode disposed at each of the first, second, and third sub-pixels on the first substrate and including a first electrode, a light-emitting layer and a second electrode, and a bank between adjacent sub-pixels along a first direction, wherein the light-emitting layer includes first, second, and third light-emitting layers, wherein each of the first and second light-emitting layers includes first and second light-emitting material layers, and the third light-emitting layer includes a second light-emitting material layer, and wherein a height of the first light-emitting material layer of each of the first and second light-emitting layer increases as it approaches the bank, and the second light-emitting material layers of the first, second, and third light-emitting layers are disposed on top and side surfaces of the bank.

19 Claims, 12 Drawing Sheets

(56) References Cited

U.S. PATENT DOCUMENTS

| | | | |
|---|---|---|---|
| 10,873,057 B2 * | 12/2020 | Youn | ................. H10K 50/17 |
| 11,864,425 B2 | 1/2024 | Baek et al. | |
| 2014/0217367 A1 | 8/2014 | Song et al. | |
| 2015/0188074 A1 | 7/2015 | Heo et al. | |
| 2015/0331291 A1 | 11/2015 | Sakaigawa | |
| 2019/0189969 A1 * | 6/2019 | Youn | ................. H10K 59/88 |
| 2020/0176531 A1 | 6/2020 | Baek et al. | |
| 2020/0194520 A1 | 6/2020 | Seo et al. | |
| 2021/0202613 A1 * | 7/2021 | Gee | ................. H10K 59/88 |

FOREIGN PATENT DOCUMENTS

| | | | |
|---|---|---|---|
| KR | 10-2015-0077715 A | 7/2015 |
| KR | 10-2016-0129995 A | 11/2016 |
| KR | 10-1698671 B1 | 1/2017 |
| KR | 10-2018-0014807 A | 2/2018 |
| KR | 10-2019-0057749 A | 5/2019 |
| KR | 10-2072801 B1 | 3/2020 |
| KR | 10-2020-0064427 A | 6/2020 |
| KR | 10-2020-0072945 A | 6/2020 |
| KR | 10-2020-0080891 A | 7/2020 |

* cited by examiner

ELECTROLUMINESCENT DISPLAY DEVICE

CROSS-REFERENCE TO RELATED APPLICATION

The present application claims priority from and the benefit under 35 U.S.C. § 119(a) of Korean Patent Application No. 10-2020-0166767 filed on Dec. 2, 2020, which is hereby incorporated by reference in its entirety.

BACKGROUND OF THE INVENTION

Technical Field

The present disclosure relates to an electroluminescent display device, and more particularly, to an electroluminescent display device having a large size and high definition.

Discussion of the Related Art

As one of flat panel display devices, an electroluminescent display device has wide viewing angles as compared with a liquid crystal display device because it is self-luminous and also has advantages of a thin thickness, light weight and low power consumption because a backlight unit is not necessary.

In addition, the electroluminescent display device is driven by low voltages of direct current (DC) and has a fast response speed. Further, the electroluminescent display device is strong against the external impacts and is used in a wide range of temperatures because its components are solids, and particularly, the electroluminescent display device can be manufactured at low costs.

The electroluminescent display device includes a plurality of pixels, each of which has first, second and third sub-pixels, and displays various color images by allowing the first, second and third sub-pixels to selectively emit light.

The first, second and third sub-pixels have red, green and blue light-emitting layers, respectively, and each light-emitting layer is formed through a vacuum thermal evaporation process in which a luminescent material is selectively deposited using a fine metal mask (FMM).

However, the evaporation process increases manufacturing costs due to preparation of the mask and has a problem in application to a large-sized and high-definition display device due to manufacturing variations, sagging, shadow effect of the mask, and the like.

SUMMARY

Accordingly, embodiments of the present disclosure are directed to an electroluminescent display device that substantially obviates one or more of the problems due to limitations and disadvantages of the related art.

An aspect of the present disclosure is to provide an electroluminescent display device having a large size and high definition.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an electroluminescent display device comprises a first substrate and a second substrate on which a pixel including first, second, and third sub-pixels are defined, a light-emitting diode disposed at each of the first, second, and third sub-pixels on an inner surface of the first substrate and including a first electrode, a light-emitting layer and a second electrode, and a bank between adjacent sub-pixels along a first direction among the first, second, and third sub-pixels, wherein the light-emitting layer includes first, second, and third light-emitting layers corresponding to the first, second, and third sub-pixels, respectively, wherein each of the first and second light-emitting layers includes a first light-emitting material layer and a second light-emitting material layer, and the third light-emitting layer includes a second light-emitting material layer, and wherein a height of the first light-emitting material layer of each of the first and second light-emitting layer increases as it approaches the bank, and the second light-emitting material layers of the first, second, and third light-emitting layers are disposed on top and side surfaces of the bank.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this application, illustrate an embodiment of the present disclosure and together with the description serve to explain the principles of the present disclosure. In the drawings.

DETAILED DESCRIPTION

Reference will now be made in detail to exemplary embodiments of the disclosure, examples of which are illustrated in the accompanying drawings.

An electroluminescent display device according to an embodiment of the present disclosure includes a plurality of pixels to display an image, and each of the plurality of pixels includes first, second and third sub-pixels. A pixel region corresponding to each sub-pixel can have a configuration shown in FIG. 1.

Figure 1:
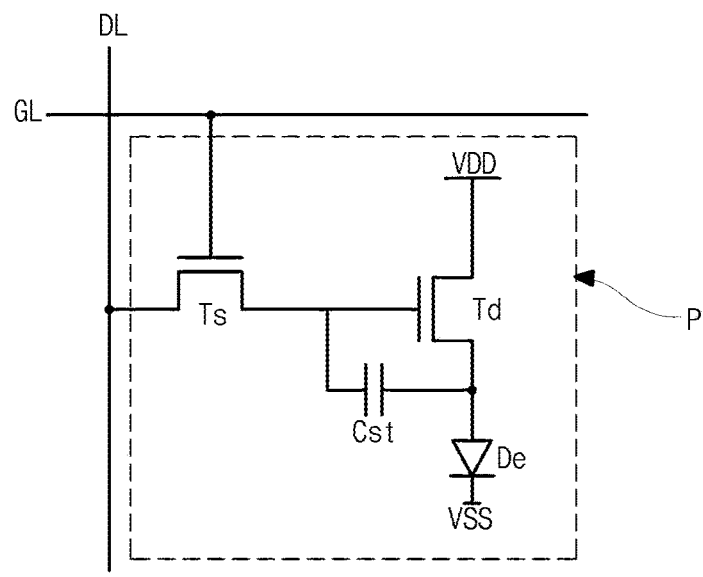
FIG. 1 is a circuit diagram of one pixel region of an electroluminescent display device according to an embodiment of the present disclosure.

FIG. 1 is a circuit diagram of one pixel region of an electroluminescent display device according to an embodiment of the present disclosure.

In FIG. 1, the electroluminescent display device according to the embodiment of the present disclosure includes a plurality of gate lines and a plurality of data lines crossing each other to define a plurality of pixel regions. Particularly, in the example of FIG. 1, a gate line GL and a data line DL cross each other to define a pixel region P. A switching thin film transistor Ts, a driving thin film transistor Td, a storage capacitor Cst, and a light-emitting diode De are formed in each pixel region P.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts and a source electrode of the driving thin film transistor Td is connected to a high voltage supply VDD. An anode of the light-emitting diode De is connected to a drain electrode of the driving thin film transistor Td, and a cathode of the light-emitting diode De is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode De is controlled, thereby displaying an image. The light-emitting diode De emits light due to the current supplied through the driving thin film transistor Td from the high voltage supply VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the pixel regions P show different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode De to be constant and the gray level shown by the light-emitting diode De to be maintained until a next frame.

Meanwhile, one or more thin film transistors and/or capacitors can be added in the pixel region P in addition to the switching and driving thin film transistors Ts and Td and the storage capacitor Cst.

For example, in the electroluminescent display device, the driving thin film transistor Td is turned on for a relatively long time while the data signal is applied to the gate electrode of the driving thin film transistor Td and the light-emitting diode De emits light to thereby display the gray level. The driving thin film transistor Td can deteriorate due to application of the data signal for a long time. Therefore, the mobility and/or threshold voltage Vth of the driving thin film transistor Td are changed, and thus the pixel region P of the electroluminescent display device displays a different gray level with respect to the same data signal. This causes non-uniform luminance, thereby lowering the image quality of the electroluminescent display device.

Accordingly, to compensate the change of the mobility and/or threshold voltage of the driving thin film transistor Td, at least one sensing thin film transistor and/or capacitor for sensing a voltage change can be further added in the pixel region P. The sensing thin film transistor and/or capacitor can be connected to a reference line for applying a reference voltage and outputting a sensing voltage.

Figure 2:
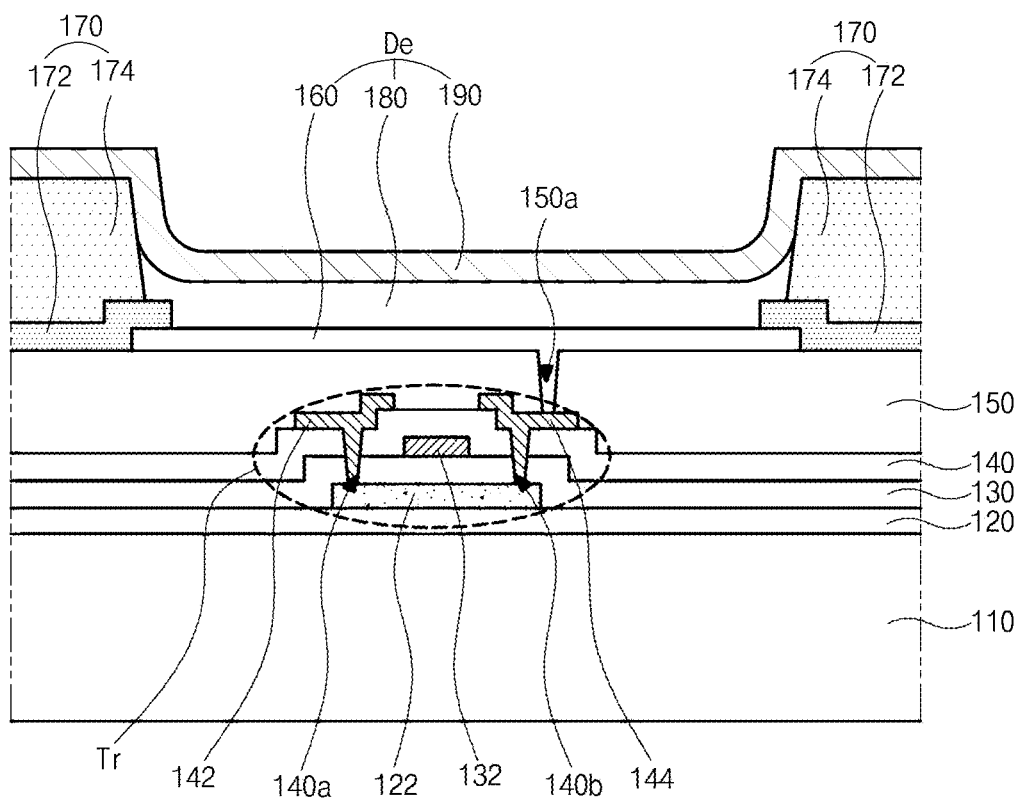
FIG. 2 is a schematic cross-sectional of an electroluminescent display device according to the embodiment of the present disclosure.

FIG. 2 is a schematic cross-sectional of an electroluminescent display device according to the embodiment of the present disclosure and shows one pixel region.

In the electroluminescent display device of FIG. 2, a buffer layer 120 is formed on a substrate 110. The buffer layer 120 is disposed substantially on an entire surface of the substrate 110. The substrate 110 can be a glass substrate or a plastic substrate. For example, polyimide can be used as the plastic substrate, but is not limited thereto. The buffer layer 120 can be formed of an inorganic material, such as silicon oxide ($SiO_2$) or silicon nitride (SiNx), and can be a single layer or multiple layers.

A patterned semiconductor layer 122 is formed on the buffer layer 120. The semiconductor layer 122 can be formed of an oxide semiconductor layer, and a light-shielding pattern can be further formed under the semiconductor layer 122. The light-shielding pattern can block light incident on the semiconductor layer 122 and can prevent the semiconductor layer 122 from deteriorating due to the light. Alternatively, the semiconductor layer 122 can be formed of polycrystalline silicon, and both ends of the semiconductor layer 122 can be doped with impurities.

A gate insulation layer 130 of an insulating material is formed on the semiconductor layer 122 substantially over the entire surface of the substrate 110. The gate insulation layer 130 can be formed of an inorganic insulating material such as silicon oxide ($SiO_2$) or silicon nitride (SiNx). When the semiconductor layer 122 is made of an oxide semiconductor material, the gate insulation layer 130 can be formed of silicon oxide ($SiO_2$). Alternatively, when the semiconductor layer 122 is made of polycrystalline silicon, the gate insulation layer 130 can be formed of silicon oxide ($SiO_2$) or silicon nitride (SiNx).

A gate electrode 132 of a conductive material such as metal is formed on the gate insulation layer 130 corresponding to the center of the semiconductor layer 122. In addition, a gate line and a first capacitor electrode can be formed on the gate insulation layer 130. The gate line extends in a first direction, and the first capacitor electrode is connected to the gate electrode 132.

In the embodiment of the present disclosure, the gate insulation layer 130 is formed substantially over the entire surface of the substrate 110. However, the gate insulation layer 130 can be patterned to have the same shape as the gate electrode 132.

An interlayer insulation layer 140 made of an insulating material is formed on the gate electrode 132 substantially over the entire surface of the substrate 110. The interlayer insulation layer 140 can be formed of an inorganic insulating material such as silicon oxide ($SiO_2$) or silicon nitride (SiNx). Alternatively, the interlayer insulation layer 140 can be formed of an organic insulating material such as photo acryl or benzocyclobutene.

The interlayer insulation layer 140 has first and second contact holes 140a and 140b exposing top surfaces of both ends of the semiconductor layer 122. The first and second contact holes 140a and 140b are disposed at both sides of the gate electrode 132 and spaced apart from the gate electrode 132. The first and second contact holes 140a and 140b are also formed in the gate insulation layer 130. Alternatively, when the gate insulation layer 130 is patterned to have the same shape as the gate electrode 132, the first and second contact holes 140a and 140b are formed only in the interlayer insulation layer 140.

Source and drain electrodes 142 and 144 of a conductive material such as metal are formed on the interlayer insulation layer 140. In addition, a data line, a power supply line and a second capacitor electrode can be further formed on the interlayer insulation layer 140.

The source and drain electrodes 142 and 144 are spaced apart from each other with the gate electrode 132 positioned therebetween and are in contact with both ends of the semiconductor layer 122 through the first and second contact holes 140a and 140b, respectively. The data line extends in a second direction and crosses the gate line to thereby define a pixel region. The power supply line for supplying a high voltage is spaced apart from the data line. The second capacitor electrode is connected to the drain electrode 144. The second capacitor electrode overlaps the first capacitor electrode to thereby constitute a storage capacitor with the interlayer insulation layer 140 therebetween as a dielectric. Alternatively, the first capacitor electrode can be connected to the drain electrode 144, and the second capacitor electrode can be connected to the gate electrode 132.

The semiconductor layer 122, the gate electrode 132, and the source and drain electrodes 142 and 144 form a thin film transistor Tr. The thin film transistor Tr has a coplanar structure in which the gate electrode 132 and the source and drain electrodes 142 and 144 are located at the same side with respect to the semiconductor layer 122.

Alternatively, the thin film transistor Tr can have an inverted staggered structure in which the gate electrode and the source and drain electrodes are located at different sides with respect to the semiconductor layer. That is, the gate electrode can be disposed under the semiconductor layer, and the source and drain electrodes can be disposed over the semiconductor layer. The semiconductor layer can be formed of oxide semiconductor or amorphous silicon.

The thin film transistor Tr corresponds to a driving thin film transistor Td of FIG. 1, and a switching thin film transistor Ts of FIG. 1 having the same structure as the thin film transistor Tr can be further formed in the pixel region on the substrate 110. The gate electrode 132 of the thin film transistor Tr can be connected to a drain electrode of the switching thin film transistor, and the source electrode 142 of the thin film transistor Tr is connected to the power supply line. In addition, a gate electrode and a source electrode of the switching thin film transistor can be connected to the gate line and the data line, respectively.

A sensing thin film transistor having the same structure of the thin film transistor Tr can be further formed in the pixel region on the substrate 110, but the present disclosure is not limited thereto.

An overcoat layer 150 of an insulating material is formed on the source and drain electrodes 142 and 144 substantially over the entire surface of the substrate 110. The overcoat layer 150 can be formed of an organic insulating material such as photo acryl or benzocyclobutene. The overcoat layer 150 can have a flat top surface.

Meanwhile, an insulation layer of an inorganic insulating material such as silicon oxide ($SiO_2$) or silicon nitride (SiNx) can be further formed under the overcoat layer 150, that is, between the thin film transistor Tr and the overcoat layer 150.

The overcoat layer 150 has a drain contact hole 150a exposing the drain electrode 144. The drain contact hole 150a can be spaced apart from the second contact hole 140b. Alternatively, the drain contact hole 150a can be disposed right over the second contact hole 140b.

A first electrode 160 is formed on the overcoat layer 150 and formed of a conductive material having a relatively high work function. The first electrode 160 is disposed in the pixel region and is in contact with the drain electrode 144 through the drain contact hole 150a. For example, the first electrode 160 can be formed of a transparent conductive material such as indium tin oxide (ITO) or indium zinc oxide (IZO), but is not limited thereto.

The electroluminescent display device according to the embodiment of the present disclosure can be a top emission type in which light of a light-emitting diode De is output toward a direction opposite the substrate 110. Accordingly, the first electrode 160 can further include a reflective electrode or a reflective layer formed of a metal material having a relatively high reflectance below the transparent conductive material. For example, the reflective electrode or reflective layer can be formed of an aluminum-palladium-copper (APC) alloy, silver (Ag) or aluminum (Al). The first electrode 160 can have a triple-layer structure of ITO/APC/ITO, ITO/Ag/ITO or ITO/Al/ITO, but is not limited thereto.

A bank 170 of an insulating material is formed on the first electrode 160. The bank 1710 can include a first bank 172 of a hydrophilic property and a second bank 174 of a hydrophobic property.

More particularly, the first bank 172 overlaps and covers edges of the first electrode 160 and exposes a central portion of the first electrode 160. The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

The second bank 174 is formed on the first bank 172. At this time, at least a top surface of the second bank 174 is hydrophobic, and a side surface of the second bank 174 can be hydrophobic or hydrophilic.

The second bank 174 has a narrower width than the first bank 172, is disposed on the first bank 172, and exposes edges of the first bank 172. A thickness of the second bank 174 can be greater than a thickness of the first bank 172. The second bank 174 can overlap the edges of the first electrode 160. Alternatively, the second bank 174 can be spaced apart from the first electrode 160 without an overlap.

The second bank 174 can be formed of an organic insulating material having a hydrophobic property. Alternatively, the second bank 174 can be formed of an organic insulating material having a hydrophilic property and can be subjected to a hydrophobic treatment.

Meanwhile, only the first bank 172 can be disposed on other edges of the first electrode 160 not shown in the figure. In addition, even if the first and second banks 172 and 174 are formed on the edges of the first electrode 160 in FIG. 2, in another embodiment, the first bank 172 can be omitted, and only the second bank 174 can overlap and cover the edges of the first electrode 160.

In FIG. 2, the first bank 172 and the second bank 174 are separately formed of different materials. However, the hydrophilic first bank 172 and the hydrophobic second bank 174 can be formed of the same material and formed as one body. For example, after an organic material layer having a hydrophobic top surface can be formed substantially over the entire surface of the substrate 110, the organic material layer can be exposed to light using a halftone mask, which includes a light-transmitting portion, a light-blocking portion and a half light-transmitting portion, and can be patterned, thereby forming the first bank 172 and the second bank 174 having different widths and thicknesses.

In addition, the drain contact hole 150a is spaced apart from the first and second banks 172 and 174, but is not limited thereto. Alternatively, the drain contact hole 150a can be disposed right under the first and second banks 172 and 174.

Next, a light-emitting layer 180 is formed on the first electrode 160 exposed by the first and second banks 172 and 174.

The light-emitting layer 180 can include at least one light-emitting material layer. The light-emitting material layer can be formed of any one of red, green and blue luminescent materials, but is not limited thereto. The luminescent material can be an organic luminescent material such as a phosphorescent compound or a fluorescent compound or can be an inorganic luminescent material such as a quantum dot.

Further, the light-emitting layer 180 can further include a first charge auxiliary layer under the light-emitting material layer and a second charge auxiliary layer over the light-emitting material layer.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto.

When the light-emitting layer 180 includes two light-emitting material layers or more, a charge generation layer can be formed between adjacent light-emitting material layers.

The light-emitting layer 180 is formed through a solution process. Thus, the process can be simplified and a display device with a large size and high resolution can be provided. A spin coating method, an ink jet printing method, or a screen printing method can be used as the solution process, but the present disclosure is not limited thereto.

When the solution is dried, a drying speed of a solvent in a region adjacent to the second bank 174 is different from that in other regions. That is, the drying speed of the solvent in the region adjacent to the second bank 174 is faster than that in the other regions. Therefore, a height of the light-emitting layer 180 in the region adjacent to the second bank 174 can rise as it gets closer to the second bank 174.

Alternatively, some of the light-emitting layer 180 can be formed through the solution process, and other of the light-emitting layer 180 can be formed through a thermal evaporation process.

A second electrode 190 of a conductive material having a relatively low work function is formed on the light-emitting layer 180 substantially over the entire surface of the substrate 110. The second electrode 190 can be formed of aluminum (Al), magnesium (Mg), silver (Ag), or an alloy thereof. The second electrode 190 has a relatively thin thickness such that light from the light-emitting layer 180 can be transmitted therethrough. Alternatively, the second electrode 190 can be formed of a transparent conductive material such as indium-gallium-oxide (IGO), but is not limited thereto.

The first electrode 160, the light-emitting layer 180 and the second electrode 190 constitute a light-emitting diode De. The first electrode 160 can serve as an anode, and the second electrode 190 can serve as a cathode, but is not limited thereto.

As described above, the electroluminescent display device according to the embodiment of the present disclosure can be a top emission type display device in which light from the light-emitting layer 180 of the light-emitting diode De is output toward a direction opposite the substrate 110, that is, output to the outside through the second electrode 190. The top emission type display device can have a wider emission area than a bottom emission type display device of the same size, to thereby improve luminance and reduce power consumption.

The light-emitting diode De of each pixel region can have an element thickness for a micro-cavity effect corresponding to a wavelength of the emitted light, thereby increasing the light efficiency. Here, the element thickness can be defined as a distance between the first electrode 160 and the second electrode 190, but is not limited thereto.

In addition, a protective layer and/or an encapsulating layer can be formed on the second electrode 190 substantially over the entire surface of the substrate 110 to block moisture or oxygen introduced from the outside, thereby protecting the light-emitting diode De.

As described above, in the electroluminescent display device according to the embodiment of the present disclosure, by forming some of the light-emitting layer 180 through the solution process, a fine metal mask is omitted to thereby reduce the manufacturing costs, and a display device with a large size and high definition can be implemented.

Recently, as a high definition display device is required, the resolution of the display device further increases, and the size of the pixel further decreases. By the way, apparatuses used in the solution process have different implementable resolutions. As the resolution of the display device increases, the size of the pixel decreases, and thus an apparatus having higher resolution than the existing one is needed. Therefore, a new apparatus must be provided, and the manufacturing costs can be increased.

However, in the present disclosure, by changing configuration and arraignment of the pixels, the light-emitting layer is formed using the existing solution process apparatus, so that the increase in the manufacturing costs can be prevented.

Hereafter, an electroluminescent display device according to an embodiment of the present disclosure is described in detail with reference to the accompanying drawings The configuration of the electroluminescent display device according to various embodiments of the present disclosure will be described in more detail with reference to accompanying drawings.

Figure 3:
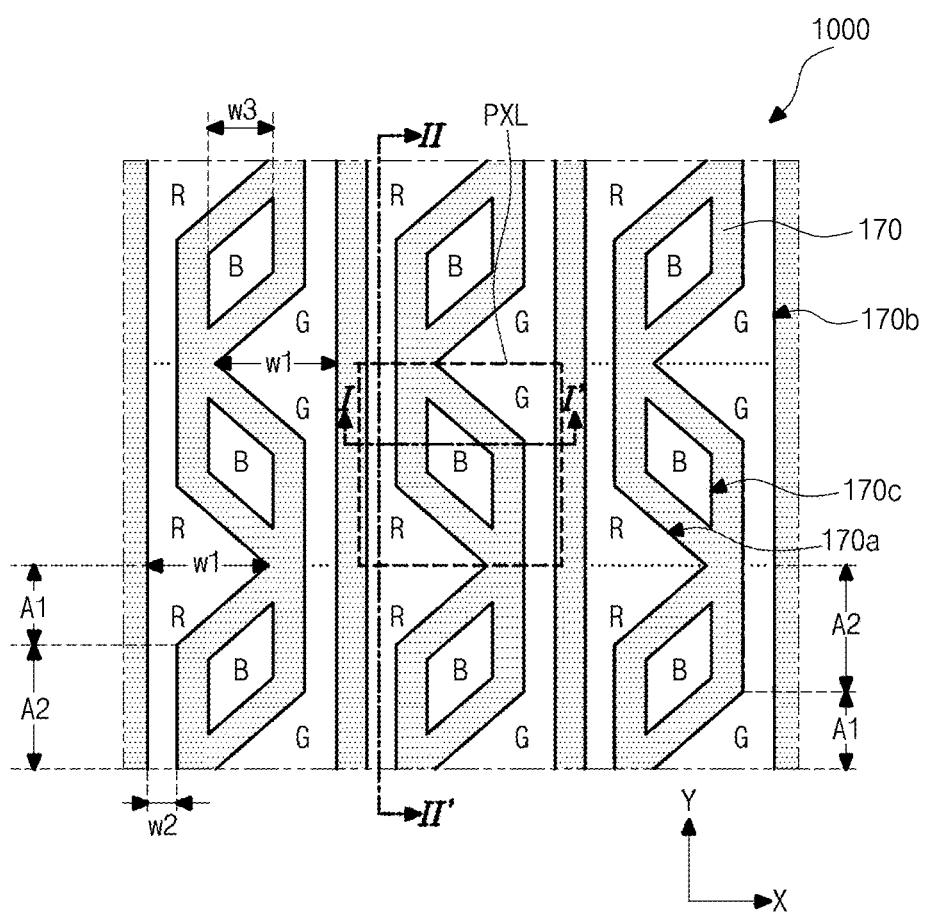
FIG. 3 is a schematic plan view of an electroluminescent display device according to a first embodiment of the present disclosure.

FIG. 3 is a schematic plan view of an electroluminescent display device according to a first embodiment of the present disclosure and mainly shows a bank configuration.

In FIG. 3, the electroluminescent display device 1000 according to the first embodiment of the present disclosure includes a plurality of pixels PXL, and each pixel PXL includes red, green, and blue sub-pixels R, G, and B. Each of the red, green, and blue sub-pixels R, G, and B can have the circuit configuration of the pixel region P of FIG. 1.

The red, green, and blue sub-pixels R, G, and B are sequentially arranged along a first direction (X direction), which is a horizontal direction in the context of the figure, and the same color sub-pixels R, G, and B are arranged along a second direction (Y direction), which is perpendicular to the first direction (X direction).

Here, the red and green sub-pixels R and G have the same shape. Each of the red and green sub-pixels R and G includes a first portion A1 and a second portion A2 arranged along the second direction (Y direction). The first portion A1 and the second portion A2 have different shapes. More particularly, the first portion A1 has a right-angled trapezoidal shape including a bottom side (first base) of a first width w1 and a top side (second base) of a second width w2 parallel to the first direction (X direction), and the second portion A2 has a rectangular shape including short sides of the second width w2 parallel to the first direction (X direction). The second portion A2 is arranged to be in contact with the top side of the first portion A1.

The red and green sub-pixels R and G are disposed upside down along the second direction (Y direction). That is, the first portion A1 of the red sub-pixel R and the second portion A2 of the green sub-pixel G are adjacent to each other along the first direction (X direction), and the second portion A2 of the red sub-pixel R and the first portion A1 of the green sub-pixel G are adjacent to each other along the first direction (X direction).

In addition, the blue sub-pixel B has a parallelogrammic shape and is arranged such that one side is inclined with a predetermined angle with respect to the first direction (X direction). The blue sub-pixel B is surrounded by the red and green sub-pixels R and G. Specifically, adjacent first and second sides of the blue sub-pixel B are arranged to face the first and second portions A1 and A2 of the red sub-pixel R, respectively, and adjacent third and fourth sides of the blue sub-pixel B are arranged to face the first and second portions A1 and A2 of the green sub-pixel G, respectively.

The blue sub-pixel B has a third width w3 along the first direction (X direction), and the third width w3 is smaller than the first width w1 and greater than the second width w2.

Meanwhile, adjacent pixels PXL along the second direction (Y direction) are arranged symmetrically to each other. Accordingly, the first portion A1 of the red sub-pixel R of one pixel PXL is in contact with the first portion A1 of the red sub-pixel R of another pixel PXL adjacent to the pixel PXL along the second direction (Y direction), and the second portion A2 of the red sub-pixel R of the pixel PXL is in contact with the second portion A2 of the red sub-pixel R of another pixel PXL adjacent to the pixel PXL along the second direction (Y direction). Similarly, the first portion A1 of the green sub-pixel G of one pixel PXL is in contact with the first portion A1 of the green sub-pixel G of another pixel PXL adjacent to the pixel PXL along the second direction (Y direction), and the second portion A2 of the green sub-pixel G of the pixel PXL is in contact with the second portion A2 of the green sub-pixel G of another pixel PXL adjacent to the pixel PXL along the second direction (Y direction).

Here, light-emitting layers (not shown) of the adjacent red sub-pixels R along the second direction (Y direction) are connected to each other, and light-emitting layers (not shown) of the adjacent green sub-pixels G along the second direction (Y direction) are connected to each other. This will be described in detail later.

On the other hand, the adjacent blue sub-pixels B along the second direction (Y direction) are spaced apart from each other. Accordingly, light-emitting layers (not shown) of the adjacent blue sub-pixels B along the second direction (Y direction) are also spaced apart from each other.

In the first embodiment of the present disclosure, the red, green, and blue sub-pixels R, G, and B have substantially the same size. However, the present disclosure is not limited thereto, and the red, green, and blue sub-pixels R, G, and B cane have different sizes. At this time, the sizes of the red, green, and blue sub-pixels R, G, and B are determined by considering lifetimes of light-emitting diodes provided at respective sub-pixels. For example, the size of the green sub-pixel G may be larger than the size of the red sub-pixel R and smaller than the size of the blue sub-pixel B.

The red, green, and blue sub-pixels R, G, and B can be defined by a bank 170. The bank 170 has first, second, and third openings 170a, 170b, and 170c corresponding to the red, green, and blue sub-pixels R, G, and B, respectively. At this time, the first opening 170a is provided to correspond to the adjacent red sub-pixels R along the second direction (Y direction), the second opening 170b is provided to correspond to the adjacent green sub-pixels G along the second direction (Y direction), and the third opening 170c is provided to correspond to each blue sub-pixel B.

In the electroluminescent display device 1000 according to the first embodiment of the present disclosure, red and green light-emitting material layers are formed in the red and green sub-pixels R and G through a solution process, respectively, and a blue light-emitting material layer is formed in all the red, green, and blue sub-pixels R, G, and B through an evaporation process. At this time, the red or green light-emitting material layer is formed by dropping and drying a solution in a relatively large area, that is, in the first portions A1 of the adjacent red or green sub-pixels R or G. Accordingly, the red or green light-emitting material layer can be formed using the existing solution process apparatus, and it is possible to prevent an increase in the manufacturing costs. Here, the first width w1 of the first portion A1 has a value corresponding to the resolution of the existing apparatus. For example, the resolution of the existing apparatus can be 144 ppi (pixel per inch), the first width w1 can be 40 μm to 60 μm, and the electroluminescent display device 1000 according to the first embodiment of the present disclosure can have a resolution of 250 ppi. However, the present disclosure is not limited thereto.

A cross-sectional structure of the electroluminescent display device according to the first embodiment of the present disclosure will be described with reference to FIG. 4 and FIG. 5.

Figure 4:
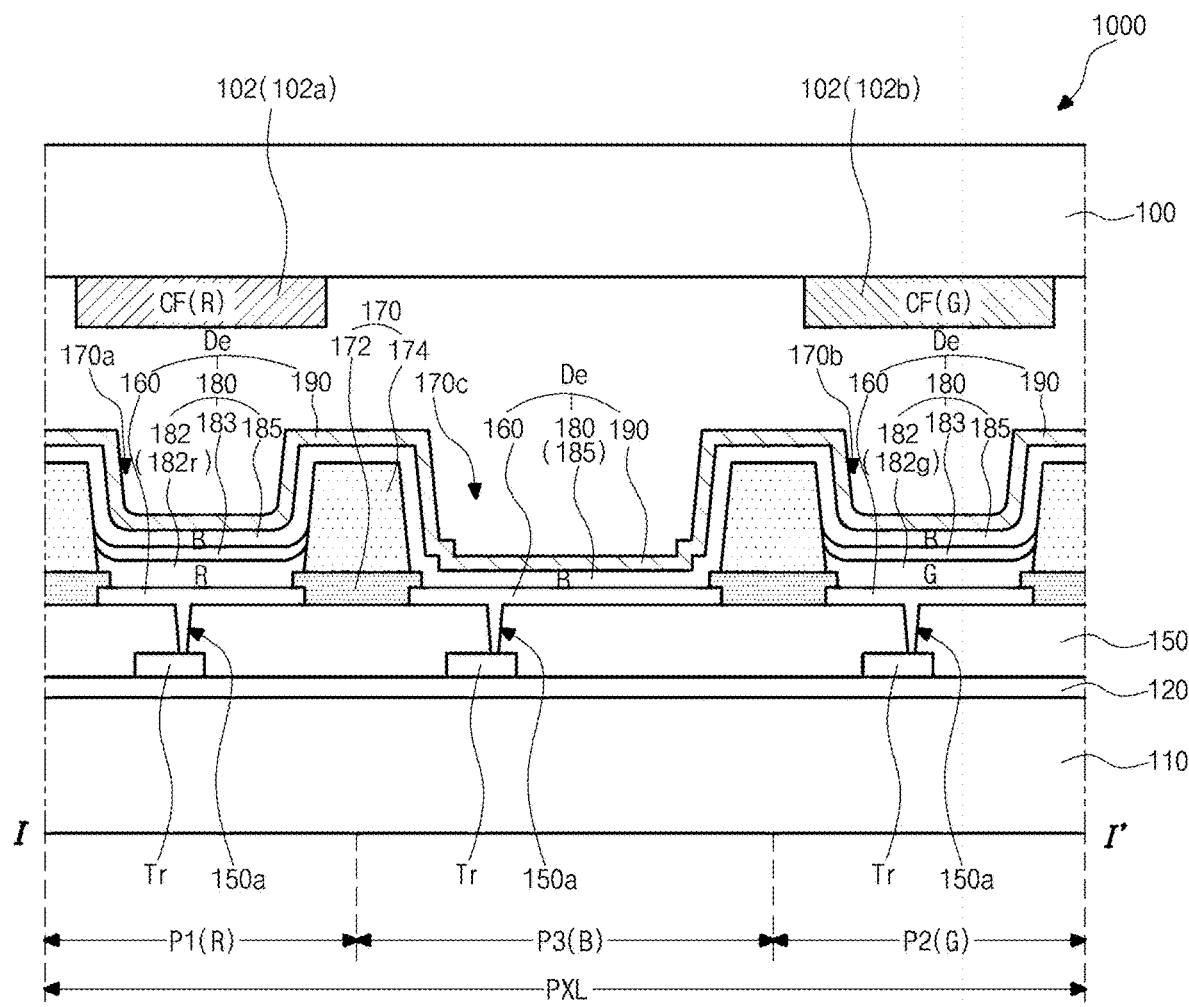
FIG. 4 is a cross-sectional view corresponding to the line I-I' of FIG. 3.
Figure 5:
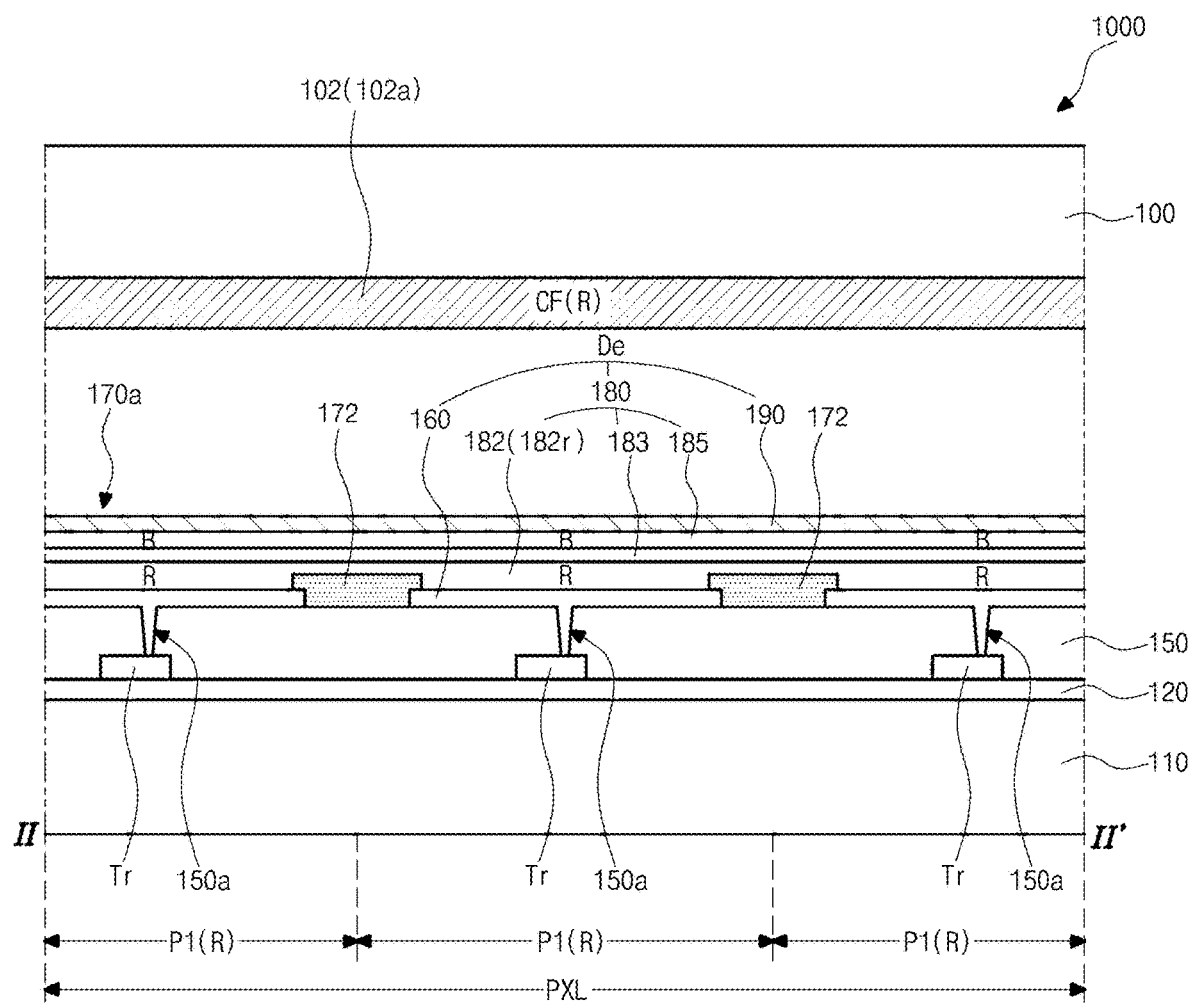
FIG. 5 is a cross-sectional view corresponding to the line II-II' of FIG. 3.

FIG. 4 is a cross-sectional view corresponding to the line I-I' of FIG. 3, and FIG. 5 is a cross-sectional view corresponding to the line II-II' of FIG. 3.

As shown in FIG. 4 and FIG. 5, in the electroluminescent display device 1000 according to the first embodiment of the present disclosure, a pixel PXL including first, second, and third sub-pixels P1, P2, and P3 are defined on a substrate 110. The first, second, and third sub-pixels P1, P2, and P3 correspond to red, green, and blue sub-pixels R, G, and B, respectively. The substrate 110 will be referred to as a first substrate hereinafter.

A buffer layer 120 is formed substantially on an entire surface of the first substrate 110, and a thin film transistor Tr is formed on the buffer layer 120 in each sub-pixel P1, P2, and P3. An overcoat layer 150 is formed on the thin film transistor Tr substantially over the entire surface of the substrate 110. Next, a first electrode 160 is formed on the overcoat layer 150 in each sub-pixel P1, P2, and P3.

Here, the thin film transistor Tr can have the configuration shown in FIG. 2, but is not limited thereto. In addition, although not shown in the figure, a gate insulation layer and an interlayer insulation layer can be further formed between the buffer layer 120 and the overcoat layer 150, and an inorganic insulation layer can be further formed between the thin film transistor Tr and the overcoat layer 150.

In each sub-pixel P1, P2, and P3, the overcoat layer 150 has a drain contact hole 150a exposing a part of the thin film transistor Tr, that is, a drain electrode. The first electrode 160 of each sub-pixel P1, P2, and P3 contacts the drain electrode of the thin film transistor Tr through the drain contact hole 150a.

A bank 170 is formed on the first electrode 160. The bank 170 overlaps and covers edges of the first electrode 160.

The bank 170 has first, second, and third openings 170a, 170b, and 170c corresponding to the first, second, and third sub-pixels P1, P2, and P3, respectively. The first electrodes 160 of the first, second, and third sub-pixels P1, P2, and P3 are exposed through the first, second, and third openings 170a, 170b, and 170c, respectively.

The bank 170 includes a first bank 172 of a hydrophilic property and a second bank 174 of a hydrophobic property.

More particularly, the first bank 172 of the hydrophilic property is formed on the first electrode 160. The first bank 172 overlaps and covers the edges of the first electrode 160.

The first bank 172 is formed between adjacent same color sub-pixels P1, P2, and P3 and between adjacent different color sub-pixels P1, P2, and P3. Alternatively, the first bank 172 can be omitted between adjacent different color sub-pixels P1, P2, and P3 and can be disposed only between adjacent same color sub-pixels P1, P2, and P3.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

The second bank 174 is formed on the first bank 172. At least a top surface of the second bank 174 can have the hydrophobic property.

The second bank 174 has a thicker thickness than the first bank 172. The second bank 174 is formed only between adjacent different color sub-pixels P1, P2, and P3 and is not formed between adjacent same color sub-pixels P1, P2, and P3. A width of the second bank 174 is narrower than a width of the first bank 172 between adjacent different color sub-pixels P1, P2, and P3, and the second bank 174 exposes edges of the first bank 172.

Meanwhile, as shown in FIG. 5, the single first opening 170a is provided to correspond to the first sub-pixels P1, and the first electrodes 160 of the first sub-pixels P1 and the first bank 172 between the adjacent first sub-pixels P1 are exposed through the first opening 170a. In addition, although not shown in the figures, the single second opening 170b is provided to correspond to the second sub-pixels P2, and the first electrodes 160 of the second sub-pixels P2 and the first bank 172 between the adjacent second sub-pixels P2 are exposed through the second opening 170b.

The second bank 174 can be formed of an organic insulating material having a hydrophobic property. Alternatively, the second bank 174 can be formed of an organic insulating material having a hydrophilic property and can be subjected to a hydrophobic treatment.

The first bank 172 of the hydrophilic property and the second bank 174 of the hydrophobic property can be formed of the same material and formed as one body.

A light-emitting layer 180 is formed on the first electrode 160 of each sub-pixel P1, P2, and P3. Here, a red light-emitting layer can be formed in the first sub-pixel P1, a green light-emitting layer can be formed in the second sub-pixel P2, and a blue light-emitting layer can be formed in the third sub-pixel P3.

The light-emitting layer 180 of each of the first and second sub-pixels P1 and P2 includes a first light-emitting material layer 182, a charge generation layer 183, and a second light-emitting material layer 185, and the light-emitting layer 180 of the third sub-pixel P3 includes a second light-emitting material layer 185. Here, the first light-emitting material layer 182 of the first sub-pixel P1 is a red light-emitting material layer 182r, and the first light-emitting material layer 182 of the second sub-pixel P2 is a green light-emitting material layer 182g. The second light-emitting material layer 185 of each of the first, second, and third sub-pixels P1, P2, and P3 is a blue light-emitting material layer.

The first light-emitting material layers 182 of the adjacent first sub-pixels P1 are connected to each other to thereby form one body, and the charge generation layers 183 of the adjacent first sub-pixels P1 are connected to each other to thereby form one body.

The first light-emitting material layer 182 and the charge generation layer 183 of the first sub-pixel P1 are formed through the solution process. Accordingly, a height of each of the first light-emitting material layer 182 and the charge generation layer 183 of the first sub-pixel P1 rises as it gets closer to the second bank 174.

At this time, solutions dropped in the adjacent first sub-pixels P1 through different nozzles are connected to each other and dried to thereby form each of the first light-emitting material layer 182 and the charge generation layer 183. Accordingly, the deviation in the dropping amount between nozzles can be minimized, and the thicknesses of the layers formed in respective sub-pixels P1 can be uniform.

Further, the first light-emitting material layer 182 and the charge generation layer 183 of the second sub-pixel P2 are also formed through the solution process. Although not shown in the figures, the first light-emitting material layers 182 of the adjacent second sub-pixels P2 are connected to each other to thereby form one body, and the charge generation layers 183 of the adjacent second sub-pixels P2 are connected to each other to thereby form one body.

On the other hand, the second light-emitting material layer 185 is formed through the evaporation process. The second light-emitting material layer 185 is formed substantially over the entire surface of the first substrate 110. Accordingly, the second light-emitting material layer 185 is formed in all the first, second, and third sub-pixels P1, P2, and P3 and is in contact with top and side surfaces of the second bank 174.

Meanwhile, although not shown in the figures, the light-emitting layer 180 can further include at least one hole auxiliary layer and at least one electron auxiliary layer. This will be described in detail later.

Next, a second electrode 190 is formed on the light-emitting layer 180. The second electrode 190 is formed substantially over the entire surface of the first substrate 110.

The first electrode 160, the light-emitting layer 180, and the second electrode 190 constitute a light-emitting diode De.

Additionally, although not shown in the figures, a capping layer can be further formed on the second electrode 190 substantially over the entire surface of the first substrate 110.

Next, a counterpart substrate 100 is disposed over the second electrode 190 and spaced apart from the second electrode 190. The counterpart substrate 100 is spaced apart from the first substrate. The pixel PXL including the first, second, and third sub-pixels P1, P2, and P3 is defined on the counterpart substrate 100. The counterpart substrate 100 will be referred to as a second substrate hereinafter.

A color filter 102 is formed on an inner surface of the second substrate 100, which faces the first substrate 110. The color filter 102 includes red and green color filters 102a and 102b, which are disposed in the first and second sub-pixels P1 and P2, respectively.

Meanwhile, a black matrix (not shown) can be further formed on the inner surface of the second substrate 100 corresponding to a border between the adjacent sub-pixels P1, P2, and P3. In addition, a passivation layer can be further formed on the inner surface of the second substrate 100 to cover the color filter 102.

A filling layer can be formed between the first substrate 110 and the second substrate 100. At this time, the filling layer can be disposed between the light-emitting diode De and the color filter 102, and more particularly, between the second electrode 190 and the color filter 102 and can be formed of a photocurable or thermosetting material.

The structure of the light-emitting layer 180 of the electroluminescent display device 1000 according to the first embodiment of the present disclosure will be described in more detail with reference to FIG. 6.

Figure 6:
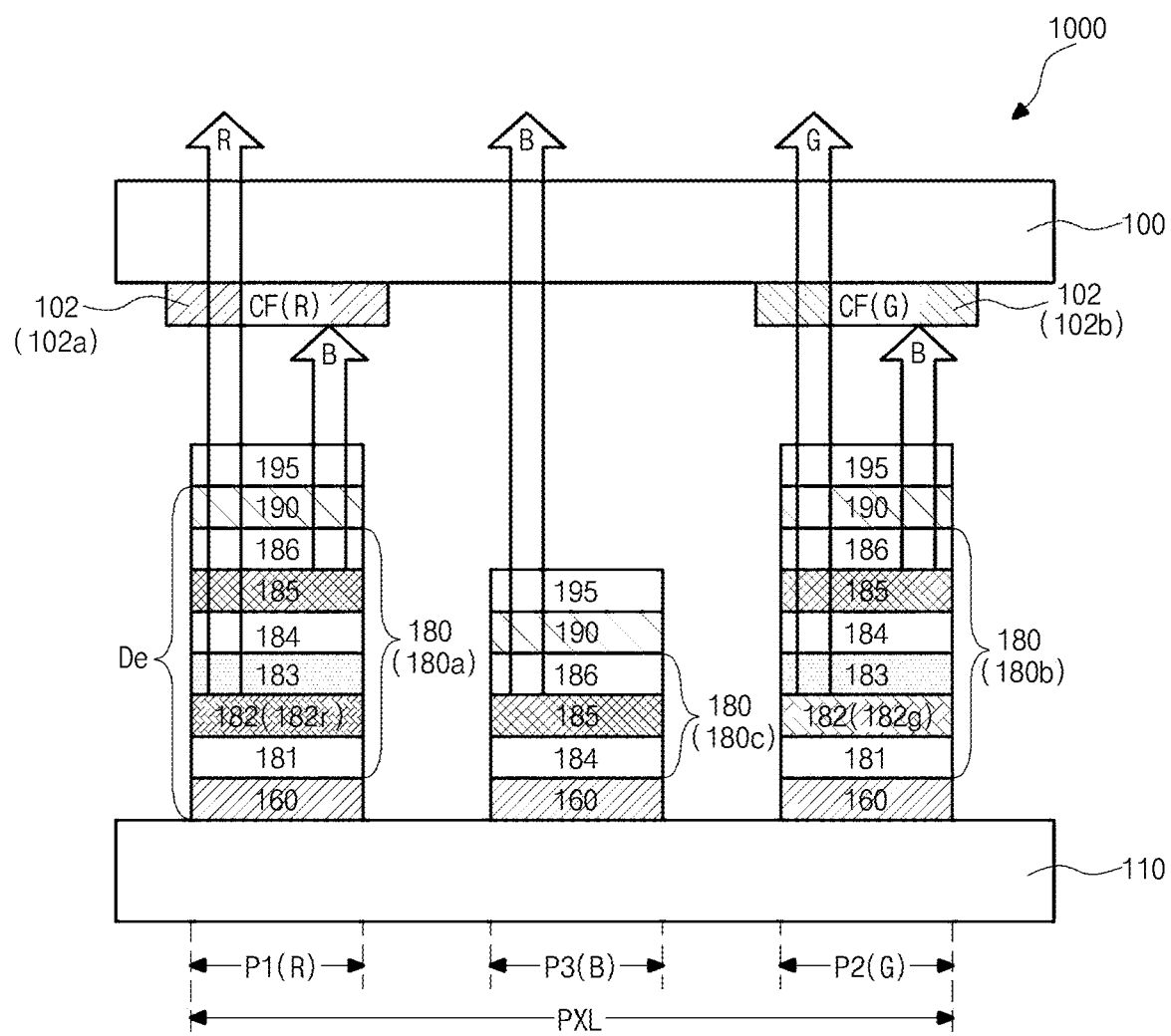
FIG. 6 is a schematic view of a pixel of the electroluminescent display device according to the first embodiment of the present disclosure.

FIG. 6 is a schematic view of a pixel of the electroluminescent display device according to the first embodiment of the present disclosure.

As shown in FIG. 6, in the electroluminescent display device 1000 according to the first embodiment of the present disclosure, the pixel PXL including the first, second, and third sub-pixels P1, P2, and P3 is defined on the first and second substrates 110 and 100. The first, second, and third sub-pixels P1, P2, and P3 correspond to red, green, and blue sub-pixels R, G, and B, respectively.

The light-emitting diode De is formed in each sub-pixel P1, P2, and P3 on an inner surface of the first substrate 110. The light-emitting diode De includes the first electrode 160, the light-emitting layer 180, and the second electrode 190.

The color filter 102 is formed in the first and second sub-pixels P1 and P2 on the inner surface of the second substrate 100. The color filter 102 includes the red color filter 102a corresponding to the first sub-pixel P1 and the green color filter 102b corresponding to the second sub-pixel P2.

The light-emitting layer 180 includes the first, second, and third light-emitting layers 180a, 180b, and 180c corresponding to the first, second, and third sub-pixels P1, P2, and P3, respectively. Each of the first and second light-emitting layers 180a and 180b includes a first hole auxiliary layer 181, a first light-emitting material layer 182, a charge generation layer 183, a second hole auxiliary layer 184, a second light-emitting material layer 185, and an electron auxiliary layer 186, and the third light-emitting layer 180c includes a second hole auxiliary layer 184, a second light-emitting material layer 185, and an electron auxiliary layer 186.

Here, the first light-emitting material layer 182 of the first sub-pixel P1 is a red light-emitting material layer 182r, and the first light-emitting material layer 182 of the second sub-pixel P2 is a green light-emitting material layer 182g. The second light-emitting material layer 185 of each of the first, second, and third sub-pixels P1, P2, and P3 is a blue light-emitting material layer.

The first light-emitting material layer 182, that is, the red light-emitting material layer 182r and the green light-emitting material layer 182g are formed through the solution process, and the second light-emitting material layer 185, that is, the blue light-emitting material layer is formed through the evaporation process.

In each of the first and second sub-pixels P1 and P2, the first hole auxiliary layer 181 is disposed between the first electrode 160 and the first light-emitting material layer 182. The first hole auxiliary layer 181 can include at least one of a hole injection layer and a hole transporting layer. For example, the first hole auxiliary layer 181 can have a double-layered structure of a hole injecting layer and a hole transporting layer.

The first hole auxiliary layer 181 is formed through the solution process.

Next, the charge generation layer 183 is formed on the first light-emitting material layer 182 in each of the first and second sub-pixels P1 and P2.

The charge generation layer 183 generates and provides electrons and holes. The charge generation layer 183 can have a PN junction structure in which an N-type charge generation layer and a P-type charge generation layer are bonded. At this time, the N-type charge generation layer is disposed as a lower layer, and the P-type charge generation layer is disposed as an upper layer. Accordingly, the N-type charge generation layer can be disposed between the first light-emitting material layer 182 and the P-type charge generation layer.

The charge generation layer 183 is formed through the solution process.

Next, the second hole auxiliary layer 184 is disposed between the charge generation layer 183 and the second light-emitting material layer 185 of each of the first and second sub-pixels P1 and P2 and between the first electrode 160 and the second light-emitting material layer 185 of the third sub-pixel P3. The second hole auxiliary layer 184 can include a hole transporting layer. At this time, the second hole auxiliary layer 184 can have a single-layered structure including one hole transporting layer. Alternatively, the second hole auxiliary layer 184 can have a double-layered structure of first and second hole transporting layers.

The second hole auxiliary layer 184 is formed through the evaporation process. Alternatively, the second hole auxiliary layer 184 can be formed through the solution process.

Next, the electron auxiliary layer 186 is disposed between the second light-emitting material layer 185 and the second electrode 190. The electron auxiliary layer 186 can include at least one of an electron transporting layer and an electron injecting layer. For example, the electron auxiliary layer 186 can have a double-layered structure of the electron transporting layer and the electron injecting layer.

Meanwhile, although not shown in the figure, a buffer layer can be formed between the first light-emitting material layer 182 and the charge generation layer 183 and/or between the second light-emitting material layer 185 and the electron auxiliary layer 186.

Each of the first and second light-emitting layers 180a and 180b has a double stack structure, and the third light-emitting layer 180c has a single stack structure. Namely, each of the first and second light-emitting layers 180a and 180b includes a first emission portion having the first light-emitting material layer 182 and a second emission portion having the second light-emitting material layer 185, the charge generation layer 183 is disposed between the first and second emission portions, and the third light-emitting layer 180c includes a single emission portion having the second light-emitting material layer 185.

A capping layer 195 is formed on the second electrode 190 of each of the first, second, and third sub-pixels P1, P2, and P3. The capping layer 195 can be formed of an insulating material having a relatively high refractive index. The wavelength of light moving along the capping layer 195 can be amplified by surface plasma resonance, and thus the intensity of the peak can be increased, thereby improving the light efficiency in a top emission type electroluminescent display device. For example, the capping layer 195 can be formed as a single layer of an organic layer or an inorganic layer or a stacked layer of organic and inorganic layers.

In the electroluminescent display device 1000 according to the first embodiment of the present disclosure, the first, second, and third sub-pixels P1, P2, and P3 emit red, green, and blue lights, respectively.

More particularly, in the first sub-pixel P1, red light R is emitted from the first light-emitting material layer 182, that is, the red light-emitting material layer 182r, and blue light B is emitted from the second light-emitting material layer 185, that is, the blue light-emitting material layer. The red light R is transmitted by the red color filter 102a, and the blue light B is absorbed by the red color filter 102a, so that only the red light R is output to the outside through the second substrate 100 in the first sub-pixel P1.

Additionally, in the second sub-pixel P2, green light G is emitted from the first light-emitting material layer 182, that is, the green light-emitting material layer 182g, and blue light B is emitted from the second light-emitting material layer 185, that is, the blue light-emitting material layer. The green light G is transmitted by the green color filter 102b, and the blue light B is absorbed by the green color filter 102b, so that only the green light G is output to the outside through the second substrate 100 in the second sub-pixel P2.

On the other hand, in the third sub-pixel P3, blue light B is emitted from the second light-emitting material layer 185, and the blue light B is output to the outside through the second substrate 100 as it is.

As described above, in the electroluminescent display device 1000 according to the first embodiment of the present disclosure, the first hole auxiliary layer 181, the first light-emitting material layer 182, and the charge generation layer 183 are formed in the first and second sub-pixels P1 and P2 having the relatively wide first width w1 of FIG. 3 through the solution process, and the second hole auxiliary layer 184, the second light-emitting material layer 185, and the electron auxiliary layer 186 are formed substantially over the entire surface of the first substrate 110 including the first, second, and third sub-pixels P1, P2, and P3 through the evaporation process. Accordingly, a high definition display device can be provided using the existing solution process apparatus.

In the first embodiment of the present disclosure, the charge generation layer 183 is formed through the solution process. However, the charge generation layer 183 can be formed through the evaporation process, and a second embodiment for this will be descried in detail with reference to drawings.

Figure 7:
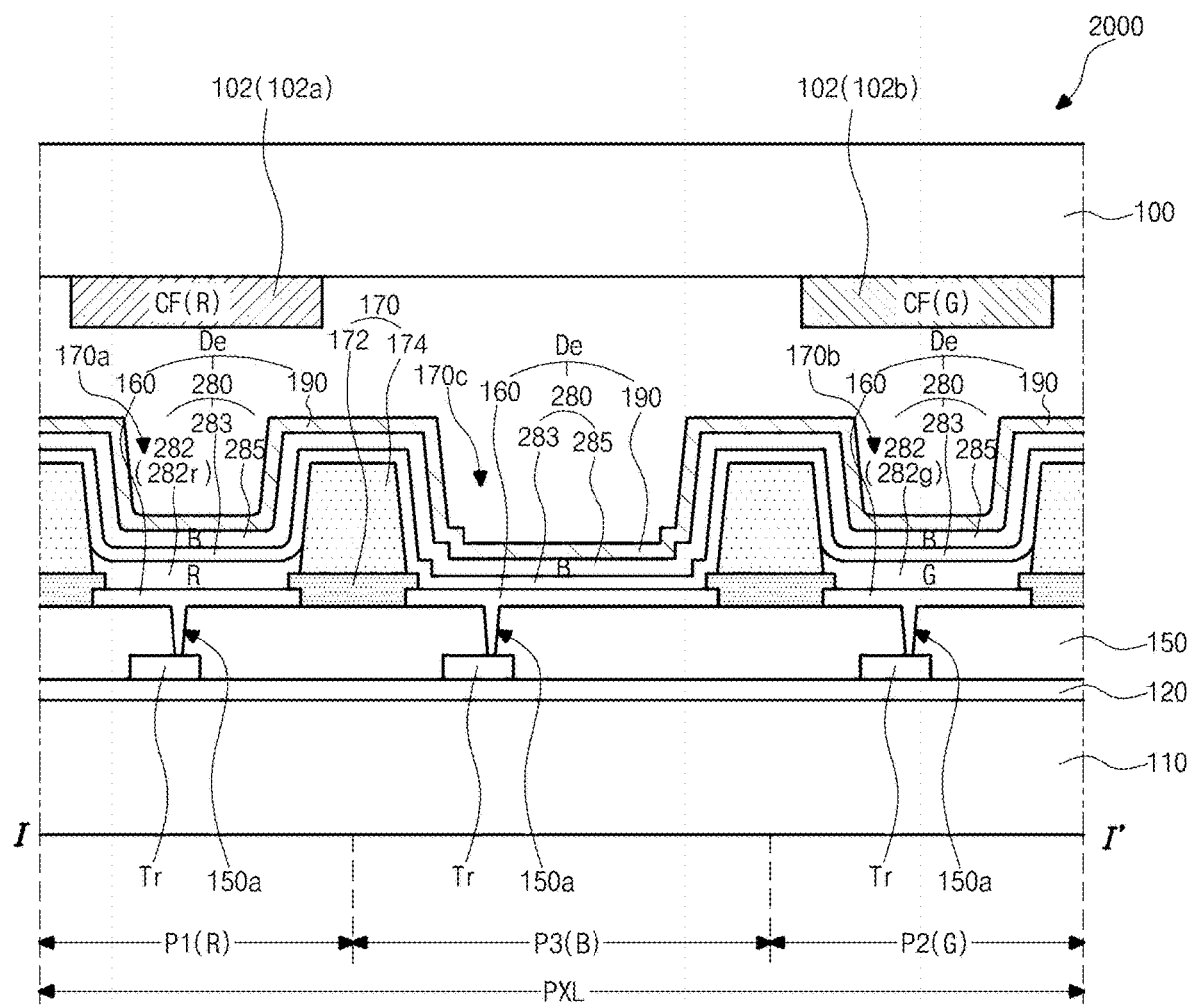
FIG. 7 is a cross-sectional view of an electroluminescent display device according to a second embodiment of the present disclosure.

FIG. 7 is a cross-sectional view of an electroluminescent display device according to a second embodiment of the present disclosure and corresponds to the line I-I' of FIG. 3. The electroluminescent display device according to the second embodiment of the present disclosure has substantially the same configuration as the first embodiment except for a light-emitting layer. The same parts as those of the first embodiment are designated by the same reference signs, and explanation for the same parts will be shortened or omitted.

As shown in FIG. 7, in the electroluminescent display device 2000 according to the second embodiment of the present disclosure, a pixel PXL including first, second, and third sub-pixels P1, P2, and P3 are defined on a first substrate 110. The first, second, and third sub-pixels P1, P2, and P3 correspond to red, green, and blue sub-pixels R, G, and B, respectively.

A buffer layer 120, thin film transistors Tr, an overcoat layer 150, and first electrodes 160 are formed on the first substrate 110, and the first electrode 160 of each of the first, second, and third sub-pixels P1, P2, and P3 is in contact with a drain electrode of the thin film transistor Tr through a drain contact hole 150a of the overcoat layer 150.

A bank 170 is formed on the first electrode 160. The bank 170 has first, second, and third openings 170a, 170b, and 170c corresponding to the first, second, and third sub-pixels P1, P2, and P3, respectively. The first electrodes 160 of the first, second, and third sub-pixels P1, P2, and P3 are exposed through the first, second, and third openings 170a, 170b, and 170c, respectively.

The bank 170 includes a first bank 172 of a hydrophilic property and a second bank 174 of a hydrophobic property.

A light-emitting layer 280 is formed on the first electrode 160 of each sub-pixel P1, P2, and P3. Here, a red light-emitting layer can be formed in the first sub-pixel P1, a green light-emitting layer can be formed in the second sub-pixel P2, and a blue light-emitting layer can be formed in the third sub-pixel P3.

The light-emitting layer 280 of each of the first and second sub-pixels P1 and P2 includes a first light-emitting material layer 282, a charge generation layer 283, and a second light-emitting material layer 285, and the light-emitting layer 280 of the third sub-pixel P3 includes a charge generation layer 283 and a second light-emitting material layer 285. Here, the first light-emitting material layer 282 of the first sub-pixel P1 is a red light-emitting material layer 282r, and the first light-emitting material layer 282 of the second sub-pixel P2 is a green light-emitting material layer 282g. The second light-emitting material layer 285 of each of the first, second, and third sub-pixels P1, P2, and P3 is a blue light-emitting material layer.

Although not shown in the figure, the first light-emitting material layers 282 of the adjacent first sub-pixels P1 are connected to each other to thereby form one body, and the second light-emitting material layers 282 of the adjacent second sub-pixels P2 are connected to each other to thereby form one body.

The first light-emitting material layers 282 of the first and second sub-pixels P1 and P2 are formed through the solution process. Accordingly, a height of the first light-emitting material layer 282 of each of the first and second sub-pixels P1 and P2 rises as it gets closer to the second bank 174.

On the other hand, the charge generation layer 283 and the second light-emitting material layer 285 are formed through the evaporation process. The charge generation layer 283 and the second light-emitting material layer 285 are formed substantially over the entire surface of the first substrate 110. Accordingly, the charge generation layer 283 and the second light-emitting material layer 285 are formed in all the first, second, and third sub-pixels P1, P2, and P3 and are also formed on top and side surfaces of the second bank 174.

Meanwhile, although not shown in the figure, the light-emitting layer 280 can further include at least one hole auxiliary layer and at least one electron auxiliary layer.

Next, a second electrode 190 is formed on the light-emitting layer 280. The second electrode 190 is formed substantially over the entire surface of the first substrate 110.

The first electrode 160, the light-emitting layer 280, and the second electrode 190 constitute a light-emitting diode De.

Next, a second substrate 100 is disposed over the second electrode 190 and spaced apart from the second electrode 190. The pixel PXL including the first, second, and third sub-pixels P1, P2, and P3 is defined on the second substrate 100.

A color filter 102 is formed on an inner surface of the second substrate 100. The color filter 102 includes red and green color filters 102a and 102b, which are disposed in the first and second sub-pixels P1 and P2, respectively.

A filling layer can be formed between the first substrate 110 and the second substrate 100. At this time, the filling layer can be disposed between the light-emitting diode De and the color filter 102, and more particularly, between the second electrode 190 and the color filter 102 and can be formed of a photocurable or thermosetting material.

The structure of the light-emitting layer 280 of the electroluminescent display device 2000 according to the second embodiment of the present disclosure will be described in more detail with reference to FIG. 8.

Figure 8:
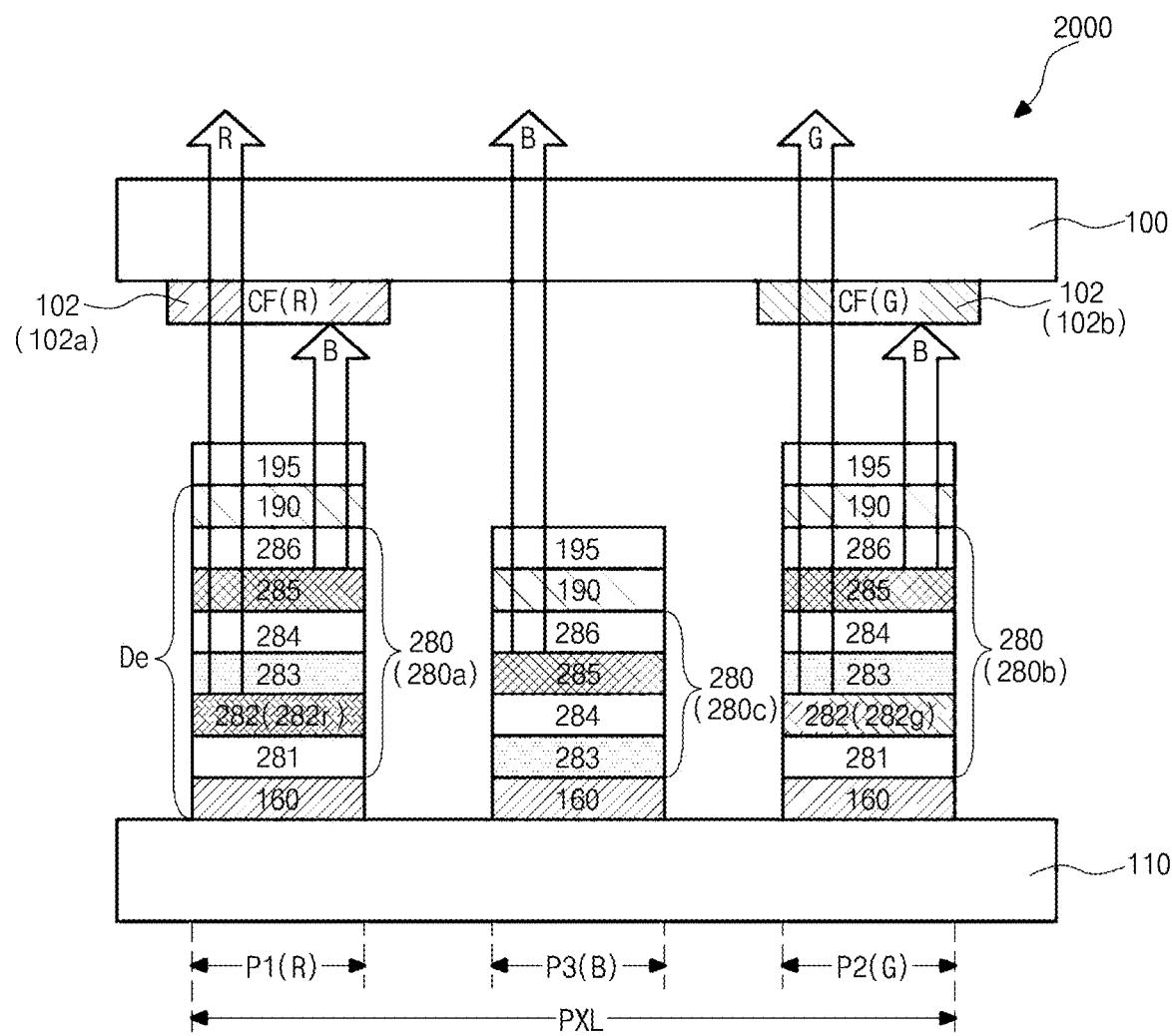
FIG. 8 is a schematic view of a pixel of the electroluminescent display device according to the second embodiment of the present disclosure.

FIG. 8 is a schematic view of a pixel of the electroluminescent display device according to the second embodiment of the present disclosure.

As shown in FIG. 8, in the electroluminescent display device 2000 according to the second embodiment of the present disclosure, the pixel PXL including the first, second, and third sub-pixels P1, P2, and P3 is defined on the first and second substrates 110 and 100. The first, second, and third sub-pixels P1, P2, and P3 correspond to red, green, and blue sub-pixels R, G, and B, respectively.

The light-emitting diode De is formed in each sub-pixel P1, P2, and P3 on an inner surface of the first substrate 110. The light-emitting diode De includes the first electrode 160, the light-emitting layer 280, and the second electrode 190.

The color filter 102 is formed in the first and second sub-pixels P1 and P2 on the inner surface of the second substrate 100. The color filter 102 includes the red color filter 102a corresponding to the first sub-pixel P1 and the green color filter 102b corresponding to the second sub-pixel P2.

The light-emitting layer 280 includes the first, second, and third light-emitting layers 280a, 280b, and 280c corresponding to the first, second, and third sub-pixels P1, P2, and P3, respectively. Each of the first and second light-emitting layers 280a and 280b includes a first hole auxiliary layer 281, a first light-emitting material layer 282, a charge generation layer 283, a second hole auxiliary layer 284, a second light-emitting material layer 285, and an electron auxiliary layer 286, and the third light-emitting layer 280c includes a charge generation layer 283, a second hole auxiliary layer 284, a second light-emitting material layer 285, and an electron auxiliary layer 286.

Here, the first light-emitting material layer 282 of the first sub-pixel P1 is a red light-emitting material layer 282r, and the first light-emitting material layer 282 of the second sub-pixel P2 is a green light-emitting material layer 282g. The second light-emitting material layer 285 of each of the first, second, and third sub-pixels P1, P2, and P3 is a blue light-emitting material layer.

The first light-emitting material layer 282, that is, the red light-emitting material layer 282r and the green light-emitting material layer 282g are formed through the solution process, and the second light-emitting material layer 285, that is, the blue light-emitting material layer is formed through the evaporation process.

In each of the first and second sub-pixels P1 and P2, the first hole auxiliary layer 281 is disposed between the first electrode 160 and the first light-emitting material layer 282. The first hole auxiliary layer 281 can include at least one of a hole injection layer and a hole transporting layer. For example, the first hole auxiliary layer 281 can have a double-layered structure of a hole injecting layer and a hole transporting layer.

The first hole auxiliary layer 281 is formed through the solution process.

Next, the charge generation layer 283 is formed on the first light-emitting material layer 282 in each of the first and second sub-pixels P1 and P2 and the first electrode 160 of the third sub-pixel P3.

The charge generation layer 283 generates and provides electrons and holes. The charge generation layer 283 can have a PN junction structure in which an N-type charge generation layer and a P-type charge generation layer are bonded. At this time, the N-type charge generation layer is disposed as a lower layer, and the P-type charge generation layer is disposed as an upper layer. Accordingly, the P-type charge generation layer can be disposed between the N-type charge generation layer and the second hole auxiliary layer 284.

The charge generation layer 283 is formed through the evaporation process.

Next, the second hole auxiliary layer 284 is disposed between the charge generation layer 283 and the second light-emitting material layer 285 of each of the first, second, and third sub-pixels P1, P2, and P3. The second hole auxiliary layer 284 can include a hole transporting layer. At this time, the second hole auxiliary layer 284 can have a single-layered structure including one hole transporting layer. Alternatively, the second hole auxiliary layer 284 can have a double-layered structure of first and second hole transporting layers.

The second hole auxiliary layer 284 is formed through the evaporation process.

Next, the electron auxiliary layer 286 is disposed between the second light-emitting material layer 285 and the second electrode 190. The electron auxiliary layer 286 can include at least one of an electron transporting layer and an electron injecting layer. For example, the electron auxiliary layer 286 can have a double-layered structure of the electron transporting layer and the electron injecting layer.

Meanwhile, although not shown in the figure, a buffer layer can be formed between the first light-emitting material layer 282 and the charge generation layer 283 and/or between the second light-emitting material layer 285 and the electron auxiliary layer 286.

Each of the first and second light-emitting layers 280a and 280b has a double stack structure, and the third light-emitting layer 280c has a single stack structure. Namely, each of the first and second light-emitting layers 280a and 280b includes a first emission portion having the first light-emitting material layer 282 and a second emission portion having the second light-emitting material layer 285, the charge generation layer 283 is disposed between the first and second emission portions, and the third light-emitting layer 280c includes a single emission portion having the second light-emitting material layer 285.

A capping layer 195 is formed on the second electrode 190 of each of the first, second, and third sub-pixels P1, P2, and P3.

In the electroluminescent display device 2000 according to the second embodiment of the present disclosure, the first, second, and third sub-pixels P1, P2, and P3 emit red, green, and blue lights, respectively.

More particularly, in the first sub-pixel P1, red light R is emitted from the first light-emitting material layer 282, that is, the red light-emitting material layer 282r, and blue light B is emitted from the second light-emitting material layer 285, that is, the blue light-emitting material layer. The red light R is transmitted by the red color filter 102a, and the blue light B is absorbed by the red color filter 102a, so that only the red light R is output to the outside through the second substrate 100 in the first sub-pixel P1.

Additionally, in the second sub-pixel P2, green light G is emitted from the first light-emitting material layer 282, that is, the green light-emitting material layer 282g, and blue light B is emitted from the second light-emitting material layer 285, that is, the blue light-emitting material layer. The green light G is transmitted by the green color filter 102b, and the blue light B is absorbed by the green color filter 102b, so that only the green light G is output to the outside through the second substrate 100 in the second sub-pixel P2.

On the other hand, in the third sub-pixel P3, blue light B is emitted from the second light-emitting material layer 285, and the blue light B is output to the outside through the second substrate 100 as it is.

As described above, in the electroluminescent display device 2000 according to the second embodiment of the present disclosure, the first hole auxiliary layer 281 and the first light-emitting material layer 282 are formed in the first and second sub-pixels P1 and P2 having the relatively wide first width w1 of FIG. 3 through the solution process, and the charge generation layer 283, the second hole auxiliary layer 284, the second light-emitting material layer 285, and the electron auxiliary layer 286 are formed substantially over the entire surface of the first substrate 110 including the first, second, and third sub-pixels P1, P2, and P3 through the evaporation process. Accordingly, a high definition display device can be provided using the existing solution process apparatus.

Meanwhile, in the second embodiment of the present disclosure, the charge generation layer 283 is disposed between the first electrode 160 and the second hole auxiliary layer 284 in the third sub-pixel P3 of the blue sub-pixel, and the operation of the light-emitting diode De having this structure will be described with reference to FIG. 9 and FIG. 10.

Figure 9:
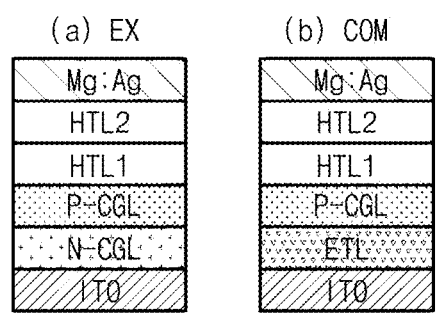
FIG. 9 is a view schematically illustrating structures of an experimental example and a comparative example for measuring current density characteristics of a blue sub-pixel according to the second embodiment of the present disclosure.
Figure 10:
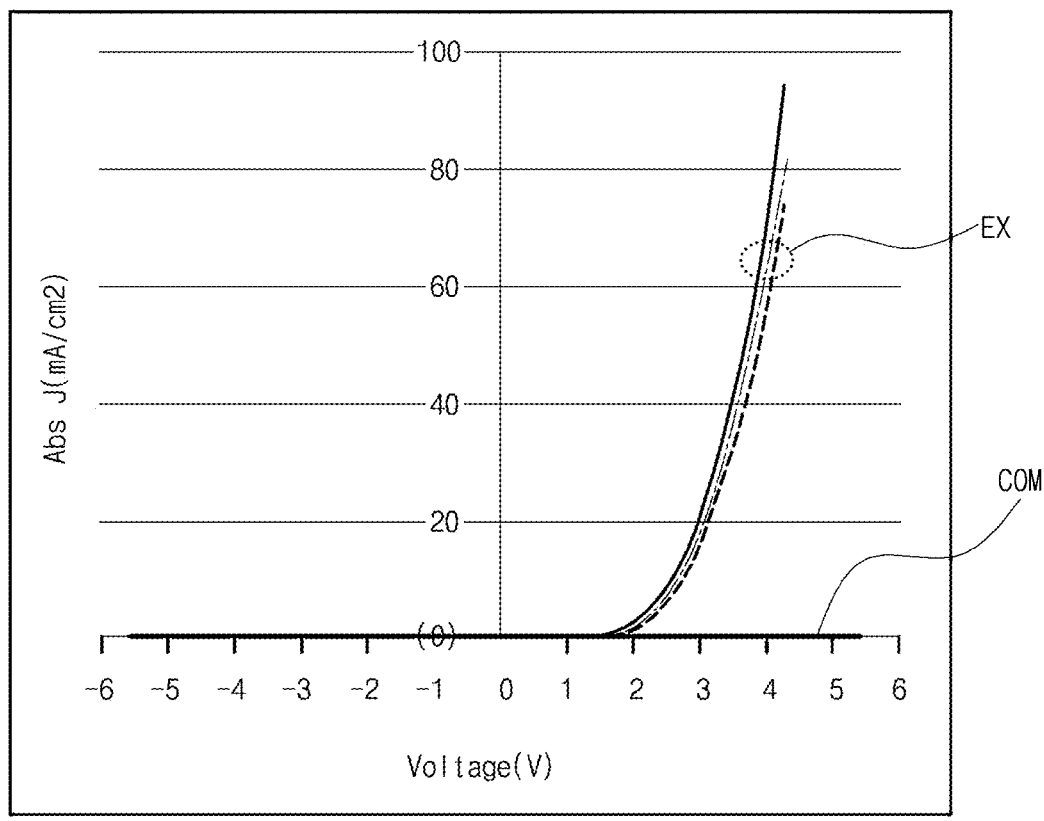
FIG. 10 is a graph showing the current density characteristics of the experimental example and the comparative example of the blue sub-pixel according to the second embodiment of the present disclosure.

FIG. 9 is a view schematically illustrating structures of an experimental example and a comparative example for measuring current density characteristics of a blue sub-pixel according to the second embodiment of the present disclosure, and FIG. 10 is a graph showing the current density characteristics of the experimental example and the comparative example of the blue sub-pixel according to the second embodiment of the present disclosure.

In FIG. 9, (a) is the structure of the experimental example EX, and the current density characteristics are checked by disposing the stacked structure under the second light-emitting material layer 285 of FIG. 8 between two electrodes.

For example, ITO and Mg:Ag are used for two electrodes, and an N-type charge generation layer N-CGL, a P-type charge generation layer P-CGL, a first hole transporting layer HTL1, and a second hole transporting layer HTL2 are sequentially disposed between the two electrodes.

Meanwhile, in FIG. 9, (b) is the structure of the comparative example COM, and an electron transporting layer ETL is disposed instead of the N-type charge generation layer N-CGL of the experimental example EX.

Here, the N-type charge generation layer N-CGL and the electron transporting layer ETL have the same electron transporting material, and the N-type charge generation layer N-CGL further includes a dopant. At this time, Ba is used for the dopant.

As shown in FIG. 10, it can be seen that the current density increases as a voltage increases in the experimental example EX while it does not operate even if the voltage is applied in the comparative example COM.

Accordingly, it can be seen that the light-emitting diode De operates even if the charge generation layer 283 of FIG. 8 is formed between the first electrode 160 of FIG. 8 and the second light-emitting material layer 285 of FIG. 8, more particularly, between the first electrode 160 of FIG. 8 and the second hole auxiliary layer 284 of FIG. 8 in the blue sub-pixel according to the second embodiment of the present disclosure.

Figure 11:
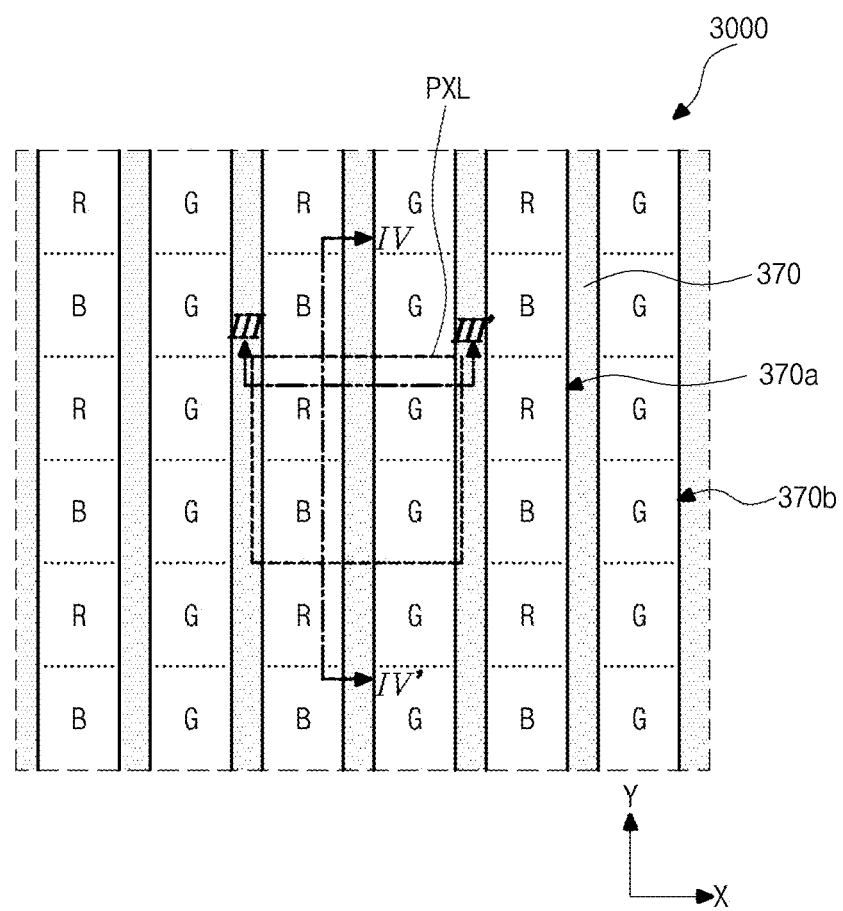
FIG. 11 is a schematic plan view of an electroluminescent display device according to a third embodiment of the present disclosure.

FIG. 11 is a schematic plan view of an electroluminescent display device according to a third embodiment of the present disclosure and mainly shows a bank configuration.

In FIG. 11, the electroluminescent display device 3000 according to the third embodiment of the present disclosure includes a plurality of pixels PXL, and each pixel PXL includes red, green, and blue sub-pixels R, G, and B. Each of the red, green, and blue sub-pixels R, G, and B can have the circuit configuration of the pixel region P of FIG. 1.

The red, green, and blue sub-pixels R, G, and B are arranged in a pentile shape. That is, one pixel PXL includes one red sub-pixel, one blue sub-pixel B, and two green sub-pixels G. The red sub-pixel R and one green sub-pixel G are arranged adjacent to each other along a first direction (X direction), the blue sub-pixel B and the other green sub-pixel G are arranged adjacent to each other along the first direction (X direction), the red sub-pixel R and the blue sub-pixel B are arranged adjacent to each other along the second direction (Y direction), and the two green sub-pixels G are arranged adjacent to each other along the second direction (Y direction).

Accordingly, the red sub-pixels R and the blue sub-pixels B are alternately arranged along the second direction (Y direction), and the green sub-pixels G are arranged in a line along the second direction (Y direction).

The red, green, and blue sub-pixels R, G, and B are shown each having a rectangular shape with angled corners, but is not limited thereto. The red, green, and blue sub-pixels R, G, and B each can have a rectangular shape with rounded corners, a circular shape, an oval shape, or the like.

In the third embodiment of the present disclosure, the red, green, and blue sub-pixels R, G, and B have substantially the same size. However, the present disclosure is not limited thereto, and the red, green, and blue sub-pixels R, G, and B cane have different sizes. At this time, the sizes of the red, green, and blue sub-pixels R, G, and B are determined by considering lifetimes of light-emitting diodes provided at respective sub-pixels. For example, the size of the green sub-pixel G may be larger than the size of the red sub-pixel R and smaller than the size of the blue sub-pixel B.

The red, green, and blue sub-pixels R, G, and B can be defined by a bank 370. The bank 370 has first and second openings 370a and 370b. The first opening 370a corresponds to the red and blue sub-pixels R and B of the same column along the second direction (Y direction), and the second opening 370b corresponds to the green sub-pixels G of the same column along the second direction (Y direction).

Here, light-emitting layers (not shown) of the adjacent red and blue sub-pixels R and B along the second direction (Y direction) are connected to each other, and light-emitting layers (not shown) of the adjacent green sub-pixels G along the second direction (Y direction) are connected to each other. This will be described in detail later.

In the electroluminescent display device 3000 according to the third embodiment of the present disclosure, red light-emitting material layers are formed in the red and blue sub-pixels R and B through a solution process, green light-emitting material layers are formed in the green sub-pixels G through a solution process, and a blue light-emitting material layer is formed in all the red, green, and blue sub-pixels R, G, and B through an evaporation process. At this time, a width of each of the red, green, and blue sub-pixels R, G, and B along the first direction (X direction) is greater than a width of each of the red, green, and blue sub-pixels arranged in a stripe shape in the same sized pixel. Accordingly, the red or green light-emitting material layer can be formed using the existing solution process apparatus, and it is possible to prevent an increase in the manufacturing costs. Here, the width of each sub-pixel R, G, and B has a value corresponding to the resolution of the existing apparatus. For example, the resolution of the existing apparatus can be 144 ppi (pixel per inch), the width of each sub-pixel R, G, and B can be 40 μm to 60 μm, and the electroluminescent display device 3000 according to the third embodiment of the present disclosure can have a resolution of 250 ppi. However, the present disclosure is not limited thereto.

A cross-sectional structure of the electroluminescent display device according to the third embodiment of the present disclosure will be described with reference to FIG. 12 and FIG. 13.

Figure 12:
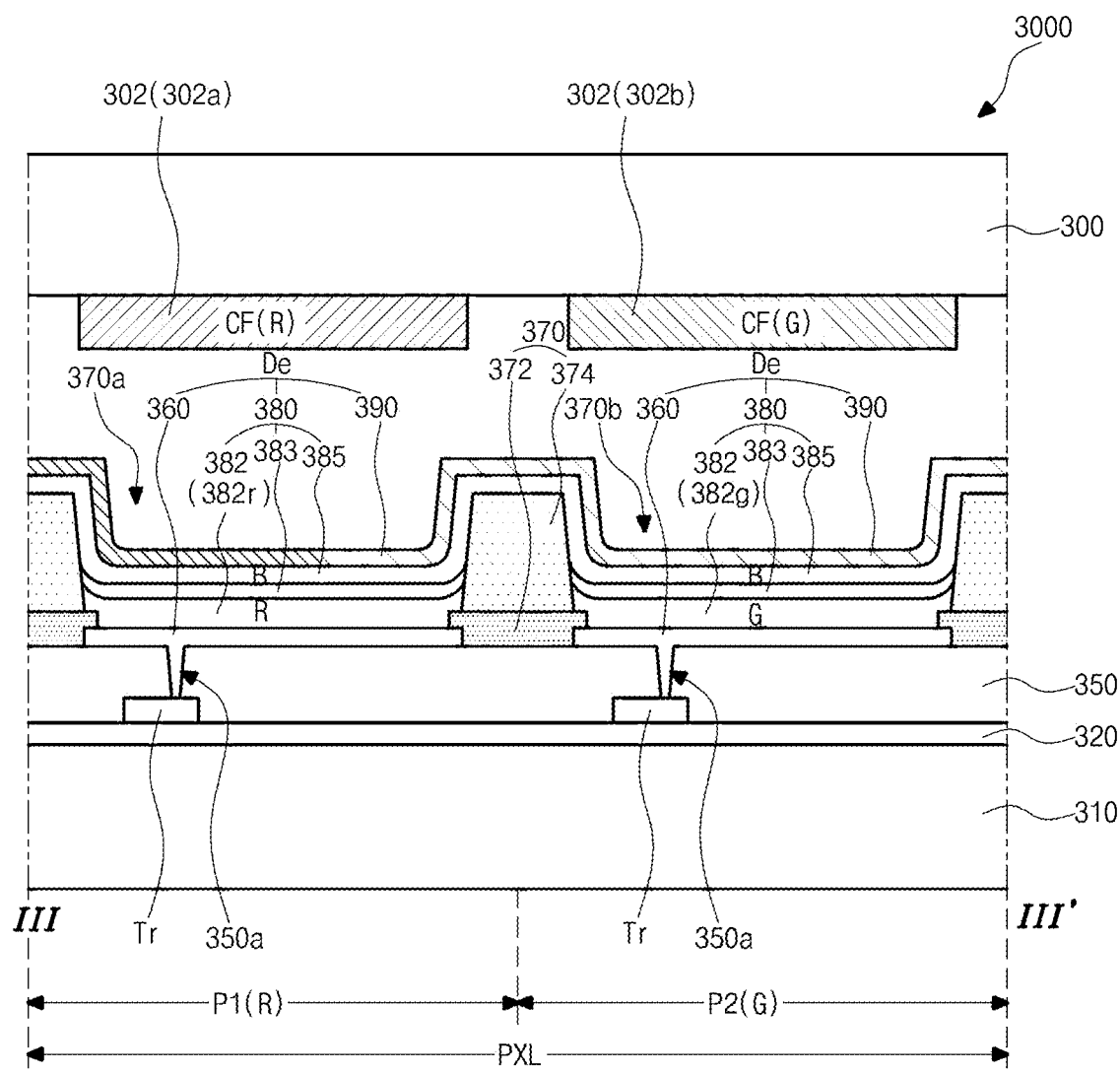
FIG. 12 is a cross-sectional view corresponding to the line III-III' of FIG. 11.
Figure 13:
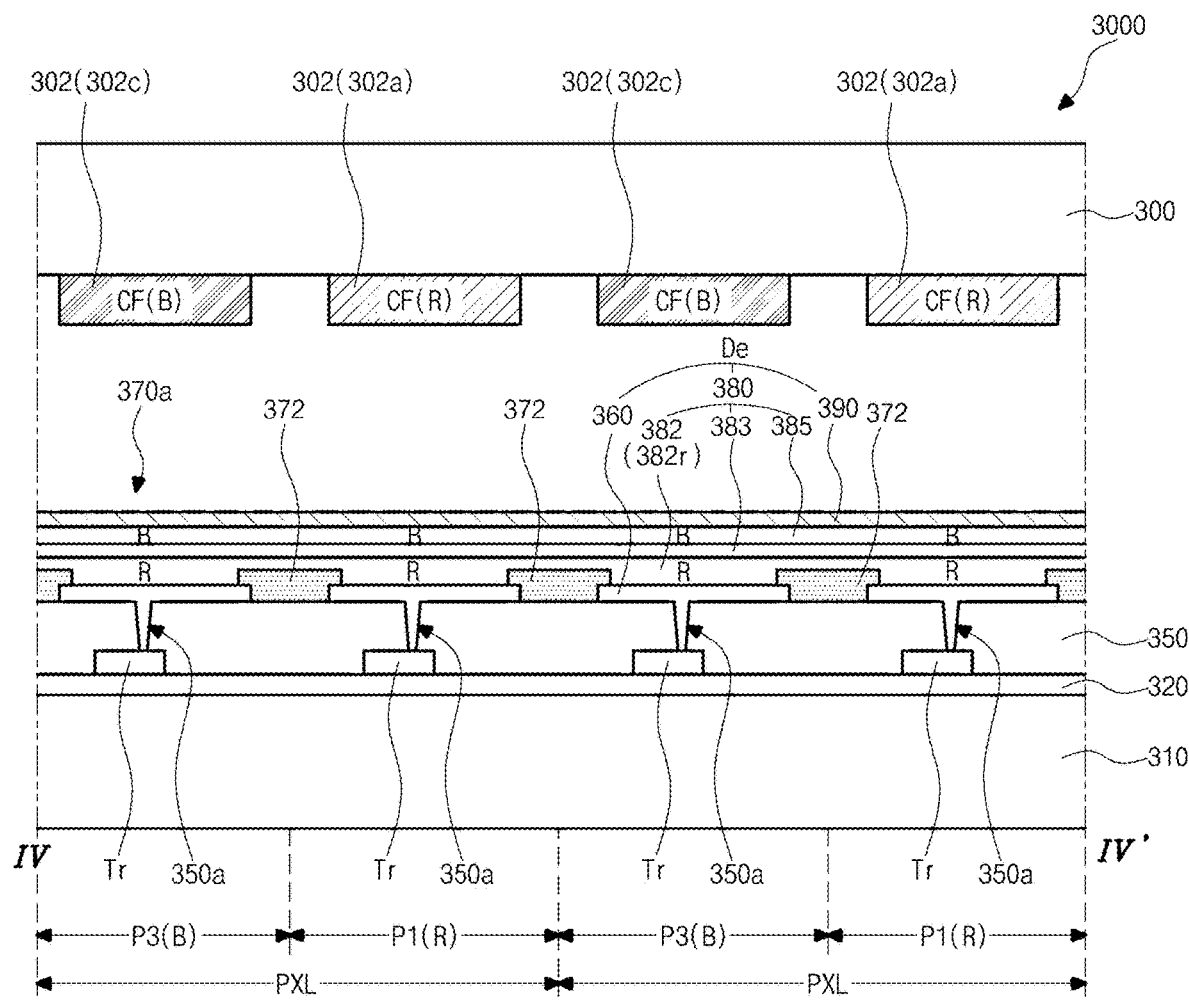
FIG. 13 is a cross-sectional view corresponding to the line IV-IV' of FIG. 11.

FIG. 12 is a cross-sectional view corresponding to the line III-III' of FIG. 11, and FIG. 13 is a cross-sectional view corresponding to the line IV-IV' of FIG. 11. The electroluminescent display device according to the third embodiment of the present disclosure has substantially the same configuration as the first embodiment except for a light-emitting layer and a color filter. The same parts as those of the first embodiment are designated by the same reference signs, and explanation for the same parts will be shortened or omitted.

As shown in FIG. 12 and FIG. 13, in the electroluminescent display device 3000 according to the third embodiment of the present disclosure, a pixel PXL including first, second, and third sub-pixels P1, P2, and P3 are defined on a first substrate 310. The first, second, and third sub-pixels P1, P2, and P3 correspond to red, green, and blue sub-pixels R, G, and B, respectively. Although not shown in the figures, the pixel PXL can further include another second sub-pixel corresponding to a green sub-pixel.

A buffer layer 320, thin film transistors Tr, an overcoat layer 350, and first electrodes 360 are formed on the first substrate 310, and the first electrode 360 of each of the first, second, and third sub-pixels P1, P2, and P3 is in contact with a drain electrode of the thin film transistor Tr through a drain contact hole 350a of the overcoat layer 350.

A bank 370 is formed on the first electrode 360. The bank 370 overlaps and covers edges of the first electrode 360.

The bank 370 has a first opening 370a corresponding to the first and third sub-pixels P1 and P3 adjacent to each other and a second opening 370b corresponding to the second sub-pixel P2. The first electrodes 360 of the first and third sub-pixels P1 and P3 are exposed through the first opening 370a, and the first electrode 360 of the second sub-pixel P2 is exposed through the second opening 370b.

The bank 370 includes a first bank 372 of a hydrophilic property and a second bank 374 of a hydrophobic property.

The first bank 372 is formed between adjacent same color sub-pixels P1, P2, and P3 and between adjacent different color sub-pixels P1, P2, and P3. More particularly, the first bank 372 is formed between the adjacent first and second sub-pixels P1 and P2 and between the adjacent first and third sub-pixel P1 and P3. In addition, although not shown in the figures, the first bank 372 is formed between adjacent second sub-pixels P2.

The second bank 374 is formed between the adjacent first and second sub-pixels P1 and P2 and is not formed between the adjacent first and third sub-pixel P1 and P3. Further, although not shown in the figures, the second bank 374 is formed between the adjacent second and third sub-pixels P2 and P3.

Meanwhile, as shown in FIG. 13, the single first opening 370a is provided to correspond to the first and third sub-pixels P1 and P3 alternately arranged, and the first bank 372 between the first and third sub-pixels P1 and P3 adjacent to the first electrodes 360 of the first and third sub-pixels P1 and P3 is exposed through the first opening 370a. In addition, although not shown in the figures, the single second opening 370b is provided to correspond to the second sub-pixels P2, and the first bank 372 between the second sub-pixels P2 adjacent to the first electrodes 360 of the second sub-pixels P2 is exposed through the second opening 370b.

The first bank 372 of the hydrophilic property and the second bank 374 of the hydrophobic property can be formed of the same material and formed as one body.

A light-emitting layer 380 is formed on the first electrode 360 of each sub-pixel P1, P2, and P3. Here, the light-emitting layers 380 of the first, second, and third sub-pixels P1, P2, and P3 have substantially the same configuration.

More particularly, the light-emitting layer 380 of each of the first, second, and third sub-pixels P1, P2, and P3 includes a first light-emitting material layer 382, a charge generation layer 383, and a second light-emitting material layer 385. Here, the first light-emitting material layer 382 of each of the first and third sub-pixels P1 and P3 is a red light-emitting material layer 382r, and the first light-emitting material layer 382 of the second sub-pixel P2 is a green light-emitting material layer 382g. The second light-emitting material layer 385 of each of the first, second, and third sub-pixels P1, P2, and P3 is a blue light-emitting material layer.

The first light-emitting material layers 382 of the adjacent first and third sub-pixels P1 and P3 are connected to each other to thereby form one body, and the charge generation layers 383 of the adjacent first and third sub-pixels P1 and P3 are connected to each other to thereby form one body.

The first light-emitting material layers 382 and the charge generation layers 383 of the first and third sub-pixels P1 and P3 are formed through the solution process. Accordingly, a height of each of the first light-emitting material layers 382 and the charge generation layer 383 of the first and third sub-pixels P1 and P3 rises as it gets closer to the second bank 374.

At this time, solutions dropped in the adjacent first and third sub-pixels P1 and P3 through different nozzles are connected to each other and dried to thereby form each of the first light-emitting material layer 382 and the charge generation layer 383. Accordingly, the deviation in the dropping amount between nozzles can be minimized, and the thicknesses of the layers formed in respective first and third sub-pixels P1 and P3 can be uniform.

Further, the first light-emitting material layer 382 and the charge generation layer 383 of the second sub-pixel P2 are also formed through the solution process. Although not shown in the figures, the first light-emitting material layers 382 of the adjacent second sub-pixels P2 are connected to each other to thereby form one body, and the charge generation layers 383 of the adjacent second sub-pixels P2 are connected to each other to thereby form one body.

On the other hand, the second light-emitting material layer 385 is formed through the evaporation process. The second light-emitting material layer 385 is formed substantially over the entire surface of the first substrate 310. Accordingly, the second light-emitting material layer 385 is formed in all the first, second, and third sub-pixels P1, P2, and P3 and is in contact with top and side surfaces of the second bank 374.

Meanwhile, although not shown in the figures, the light-emitting layer 380 can further include at least one hole auxiliary layer and at least one electron auxiliary layer. This will be described in detail later.

Next, a second electrode 390 is formed on the light-emitting layer 380. The second electrode 390 is formed substantially over the entire surface of the first substrate 310.

The first electrode 360, the light-emitting layer 380, and the second electrode 390 constitute a light-emitting diode De.

Additionally, although not shown in the figures, a capping layer can be further formed on the second electrode 390 substantially over the entire surface of the first substrate 310.

Next, a second substrate 300 is disposed over the second electrode 390 and spaced apart from the second electrode 390. The pixel PXL including the first, second, and third sub-pixels P1, P2, and P3 is defined on the counterpart substrate 300.

A color filter 302 is formed on an inner surface of the second substrate 300, which faces the first substrate 310. The color filter 302 includes first, second, and third color filters 302a, 302b, and 302c, which are disposed in the first, second, and third sub-pixels P1, P2, and P3, respectively. Here, the first color filter 302a is a red color filter, the second color filter 302b is a green color filter, and the third color filter 302c is a blue color filter.

A filling layer can be formed between the first substrate 310 and the second substrate 300. At this time, the filling layer can be disposed between the light-emitting diode De and the color filter 302, and more particularly, between the second electrode 390 and the color filter 302 and can be formed of a photocurable or thermosetting material.

The structure of the light-emitting layer 380 of the electroluminescent display device 3000 according to the third embodiment of the present disclosure will be described in more detail with reference to FIG. 14.

Figure 14:
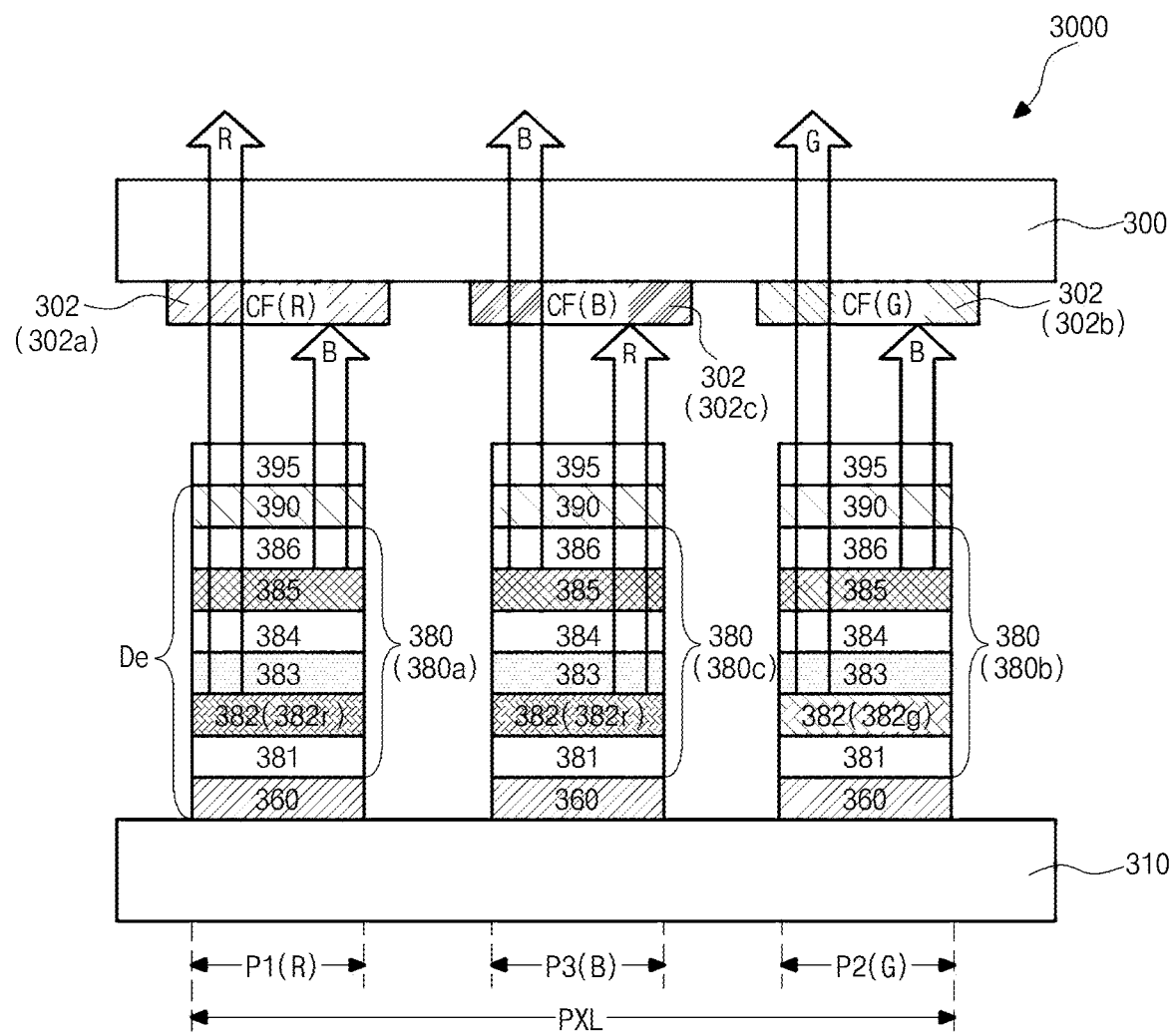
FIG. 14 is a schematic view of a pixel of the electroluminescent display device according to the third embodiment of the present disclosure.

FIG. 14 is a schematic view of a pixel of the electroluminescent display device according to the third embodiment of the present disclosure.

As shown in FIG. 14, in the electroluminescent display device 3000 according to the third embodiment of the present disclosure, the pixel PXL including the first, second, and third sub-pixels P1, P2, and P3 is defined on the first and second substrates 310 and 300. The first, second, and third sub-pixels P1, P2, and P3 correspond to red, green, and blue sub-pixels R, G, and B, respectively.

The light-emitting diode De is formed in each sub-pixel P1, P2, and P3 on an inner surface of the first substrate 310. The light-emitting diode De includes the first electrode 360, the light-emitting layer 380, and the second electrode 390.

The color filter 302 is formed in the first, second, and third sub-pixels P1, P2, and P3 on the inner surface of the second substrate 300. The color filter 302 includes first, second, and third color filters 302a, 302b, and 302c corresponding to the first, second, and third sub-pixels P1, P2, and P3, respectively, and the first, second, and third color filters 302a, 302b, and 302c are red, green, and blue color filters, respectively.

The light-emitting layer 380 includes the first, second, and third light-emitting layers 380a, 380b, and 380c corresponding to the first, second, and third sub-pixels P1, P2, and P3, respectively. Each of the first, second, and third light-emitting layers 380a, 380b, and 380c includes a first hole auxiliary layer 381, a first light-emitting material layer 382, a charge generation layer 383, a second hole auxiliary layer 384, a second light-emitting material layer 385, and an electron auxiliary layer 386.

Here, the first light-emitting material layer 382 of the first and third sub-pixel P1 and P3 is a red light-emitting material layer 382r, and the first light-emitting material layer 382 of the second sub-pixel P2 is a green light-emitting material layer 382g. The second light-emitting material layer 385 of each of the first, second, and third sub-pixels P1, P2, and P3 is a blue light-emitting material layer. Accordingly, the first light-emitting layer 380a and the third light-emitting layer 380c have the same configuration.

The first light-emitting material layer 382, that is, the red light-emitting material layer 382r and the green light-emitting material layer 382g are formed through the solution process, and the second light-emitting material layer 385, that is, the blue light-emitting material layer is formed through the evaporation process.

In each of the first, second, and third sub-pixels P1, P2, and P3, the first hole auxiliary layer 381 is disposed between the first electrode 360 and the first light-emitting material layer 382. The first hole auxiliary layer 381 can include at least one of a hole injection layer and a hole transporting layer. For example, the first hole auxiliary layer 381 can have a double-layered structure of a hole injecting layer and a hole transporting layer.

The first hole auxiliary layer 381 is formed through the solution process.

Next, the charge generation layer 383 is formed on the first light-emitting material layer 382 in each of the first, second, and third sub-pixels P1, P2, and P3.

The charge generation layer 383 generates and provides electrons and holes. The charge generation layer 383 can have a PN junction structure in which an N-type charge generation layer and a P-type charge generation layer are bonded. At this time, the N-type charge generation layer is disposed as a lower layer, and the P-type charge generation layer is disposed as an upper layer. Accordingly, the P-type charge generation layer can be disposed between the N-type charge generation layer and the second hole auxiliary layer 384.

The charge generation layer 383 is formed through the solution process. Alternatively, the charge generation layer 383 can be formed through the evaporation process. In this case, similarly to the second light-emitting material layer 385, the charge generation layer 383 can be formed on the top and side surfaces of the second bank 374 of FIG. 12.

Next, the second hole auxiliary layer 384 is disposed between the charge generation layer 383 and the second light-emitting material layer 385 of each of the first, second, and third sub-pixels P1, P2, and P3. The second hole auxiliary layer 384 can include a hole transporting layer. At this time, the second hole auxiliary layer 384 can have a single-layered structure including one hole transporting layer. Alternatively, the second hole auxiliary layer 384 can have a double-layered structure of first and second hole transporting layers.

The second hole auxiliary layer 384 is formed through the evaporation process. Alternatively, the second hole auxiliary layer 384 can be formed through the solution process, and in this case, the N-type charge generation layer and the P-type charge generation layer are formed through the solution process.

Next, the electron auxiliary layer 386 is disposed between the second light-emitting material layer 385 and the second electrode 390. The electron auxiliary layer 386 can include at least one of an electron transporting layer and an electron injecting layer. For example, the electron auxiliary layer 386 can have a double-layered structure of the electron transporting layer and the electron injecting layer.

Meanwhile, although not shown in the figure, a buffer layer can be formed between the first light-emitting material layer 382 and the charge generation layer 383 and/or between the second light-emitting material layer 385 and the electron auxiliary layer 386.

Each of the first, second, and third light-emitting layers 380a, 380b, and 380c has a double stack structure. Namely, each of the first, second, and third light-emitting layers 380a, 380b, and 380c includes a first emission portion having the first light-emitting material layer 382 and a second emission portion having the second light-emitting material layer 385, and the charge generation layer 383 is disposed between the first and second emission portions.

A capping layer 395 is formed on the second electrode 390 of each of the first, second, and third sub-pixels P1, P2, and P3.

In the electroluminescent display device 3000 according to the third embodiment of the present disclosure, the first, second, and third sub-pixels P1, P2, and P3 emit red, green, and blue lights, respectively.

More particularly, in the first sub-pixel P1, red light R is emitted from the first light-emitting material layer 382, that is, the red light-emitting material layer 382r, and blue light B is emitted from the second light-emitting material layer 385, that is, the blue light-emitting material layer. The red light R is transmitted by the red color filter 302a, and the blue light B is absorbed by the red color filter 302a, so that only the red light R is output to the outside through the second substrate 300 in the first sub-pixel P1.

Additionally, in the second sub-pixel P2, green light G is emitted from the first light-emitting material layer 382, that is, the green light-emitting material layer 382g, and blue light B is emitted from the second light-emitting material layer 385, that is, the blue light-emitting material layer. The green light G is transmitted by the green color filter 302b, and the blue light B is absorbed by the green color filter 302b, so that only the green light G is output to the outside through the second substrate 300 in the second sub-pixel P2.

On the other hand, in the third sub-pixel P3, red light R is emitted from the first light-emitting material layer 382, that is, the red light-emitting material layer 382r, and blue light B is emitted from the second light-emitting material layer 385, that is, the blue light-emitting material layer. The red light R is absorbed by the blue color filter 302c, and the blue light B is transmitted by the blue color filter 302c, so that only the blue light B is output to the outside through the second substrate 300 in the third sub-pixel P3.

As described above, in the electroluminescent display device 3000 according to the third embodiment of the present disclosure, the first, second, and third sub-pixels P1, P2, and P3 are arranged in the pentile shape, so that each sub-pixel P1, P2, and P3 has a relatively wide width. Thus, the first hole auxiliary 381 and the first light-emitting material layer 382 of feach sub-pixel P1, P2, and P3 are formed through the solution process, the second light-emitting material layer 385 and the electron auxiliary layer 386 are formed substantially over the entire surface of the first substrate 310 including the first, second, and third sub-pixels P1, P2, and P3 through the evaporation process, and the charge generation layer 383 and the second hole auxiliary layer 384 are formed through the solution process or the evaporation process. Accordingly, a high definition display device can be provided using the existing solution process apparatus.

As described above, in the embodiments of the present disclosure, the first and second sub-pixels P1 and P2 are configured to have the double stack structure of the first emission portion and the second emission portion and the third sub-pixel P3 is configured to have the single stack structure, or all the first, second, and third sub-pixels P1, P2, and P3 are configured to have the double stack structure. At this time, the charge generation layer 183, 283, and 383 is provided between the first emission portion and the second emission portion, and the charge generation layer 183, 283, and 383 includes the N-type charge generation layer and the P-type charge generation layer.

Here, the N-type charge generation layer can include an N-type charge generation material and a dopant. For example, the N-type charge generation material can be selected from one of tris-(8-hydroxyquinoline aluminum (Alq3), 2-biphenyl-4-yl-5-(4-t-butylphenyl)-1,3,4-oxadiazole (PBD), spiro-PBD, lithium quinolate (Liq), 1,3,5-tris(N-phenylbenzimidazol-2-yl)benzene (TPBi), bis(2-methyl-8-quinolinolato-N1,O8)-(1,1'-biphenyl-4-olato)aluminum (BAlq), 4,7-diphenyl-1,10-phenanthroline (Bphen), 2,9-bis (naphthalene-2-yl)4,7-diphenyl-1,10-phenanthroline (NB-phen), 2,9-dimethyl-4,7-diphenyl-1,10-phenathroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazol (NTAZ), 1,3,5-tri(p-pyrid-3-yl-phenyl)benzene (Tp-PyPB), 2,4,6-tris(3'-(pyridin-3-yl)biphenyl-3-yl)1,3,5-triazine (TmPPPyTz), Poly[9,9-bis(3'-((N,N-dimethyl)-N-ethylammonium)-propyl)-2,7-fluorene]-alt-2,7-(9,9-dioctylfluorene)] (PFNBr), tris(phenylquinoxaline (TPQ), and diphenyl-4-triphenylsilyl-phenylphosphine oxide (TSPO1), and the dopant can be selected from one of Ba, Li, and Yb. In the N-type charge generation layer, the dopant can have about 0.1 to 20 wt %, beneficially, about 1 to 10 wt %.

Meanwhile, the P-type charge generation layer can be formed of an organic material doped with metal or a P-type dopant. For example, the metal contained in the P-type charge generation layer can be selected from a group including Al, Cu, Fe, Pb, Zn, Au, Pt, W, In, Mo, Ni, and Ti, and the P-type dopant can be F4-TCNQ. In addition, the organic material contained in the P-type charge generation layer can be selected from a group including NPB, TPD, N,N,N',N'-tetranaphthalenyl-benzidine (TNB), and HAT-CN.

In the present disclosure, by forming the light-emitting layer of all sub-pixels or some sub-pixels through the solution process, the fine metal mask can be omitted to thereby reduce the manufacturing costs, and a display device with a large size and high definition can be implemented.

In addition, the light-emitting layers of the adjacent sub-pixels are connected to each other and formed as one body, thereby minimizing the deviation in the dropping amount between nozzles and uniformly forming the thicknesses of the light-emitting layers of the sub-pixels. Therefore, the mura is prevented, thereby preventing the image quality of the display device from being lowered.

Moreover, all sub-pixels or some sub-pixels are configured to have the double stack structure and the layers of the light-emitting layer of each sub-pixel are formed through the solution process and the evaporation process. Accordingly, it is possible to provide a high definition display device using the existing solution process apparatus, so that the increase in the manufacturing costs can be prevented.

It will be apparent to those skilled in the art that various modifications and variations can be made in the electroluminescent display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An electroluminescent display device, comprising:
   a first substrate and a second substrate on which a pixel including first, second, and third sub-pixels are defined;
   a light-emitting diode disposed at each of the first, second, and third sub-pixels on an inner surface of the first substrate and including a first electrode, a light-emitting layer and a second electrode; and
   a bank between adjacent sub-pixels along a first direction among the first, second, and third sub-pixels,
   wherein the light-emitting layer includes first, second, and third light-emitting layers corresponding to the first, second, and third sub-pixels, respectively,
   wherein each of the first and second light-emitting layers includes a first light-emitting material layer and a second light-emitting material layer, and the third light-emitting layer includes a second light-emitting material layer,
   wherein a height of the first light-emitting material layer of each of the first and second light-emitting layer increases as it approaches the bank, and the second light-emitting material layers of the first, second, and third light-emitting layers are disposed on top and side surfaces of the bank,
   wherein each of the first and second sub-pixels includes a plurality of portions, and the third sub-pixel has a plurality of sides arranged to face the plurality of portions of the first and second sub-pixels, respectively,
   wherein each of the first and second sub-pixels includes a first portion and a second portion having different shapes from each other, and the third sub-pixel has first, second, third, and fourth sides, and
   wherein the first and second sides of the third sub-pixel are arranged to face the first and second portions of the first sub-pixel, respectively, and the third and fourth sides of the third sub-pixels are arranged to face the first and second portions of the second sub-pixel, respectively.

2. The electroluminescent display device of claim 1, wherein each of the first and second light-emitting layers further includes a charge generation layer between the first light-emitting material layer and the second light-emitting material layer.

3. The electroluminescent display device of claim 2, wherein the third light-emitting layer further includes a charge generation layer between the first electrode and the second light-emitting material layer.

4. The electroluminescent display device of claim 3, wherein the charge generation layers of the first, second, and third light-emitting layers are disposed on the top and side surfaces of the bank.

5. The electroluminescent display device of claim 1, further comprising a color filter on an inner surface of the second substrate,
   wherein the color filter includes a red color filter and a green color filter disposed in the first and second sub-pixels, respectively.

6. An electroluminescent display device, comprising:
   a first substrate and a second substrate on which a pixel including first, second, and third sub-pixels are defined;
   a light-emitting diode disposed at each of the first, second, and third sub-pixels on an inner surface of the first substrate and including a first electrode, a light-emitting layer and a second electrode; and
   a bank between adjacent sub-pixels along a first direction among the first, second, and third sub-pixels,
   wherein the light-emitting layer includes first, second, and third light-emitting layers corresponding to the first, second, and third sub-pixels, respectively,
   wherein each of the first and second light-emitting layers includes a first light-emitting material layer and a second light-emitting material layer, and the third light-emitting layer includes a second light-emitting material layer,
   wherein a height of the first light-emitting material layer of each of the first and second light-emitting layer increases as it approaches the bank, and the second light-emitting material layers of the first, second, and third light-emitting layers are disposed on top and side surfaces of the bank,
   wherein each of the first and second sub-pixels includes a plurality of portions, and the third sub-pixel has a plurality of sides arranged to face the plurality of portions of the first and second sub-pixels, respectively,
   wherein the bank is not provided between the first light-emitting layer and another first light-emitting layer along a second direction perpendicular to the first direction, and the first light-emitting layer and the another first light-emitting layer are connected to each other and formed as one body, and
   wherein the bank is not provided between the second light-emitting layer and another second light-emitting layer along the second direction, and the second light-emitting layer and the another second light-emitting layer are connected to each other and formed as one body.

7. The electroluminescent display device of claim 6, wherein the bank is further provided between the third light-emitting layer and another third light-emitting layer along the second direction, and the third light-emitting layer and the another third light-emitting layer are spaced apart from each other.

8. The electroluminescent display device of claim 1, wherein the third light-emitting layer further includes a first light-emitting material layer between the first electrode and the second light-emitting material layer.

9. The electroluminescent display device of claim 8, wherein each of the first, second, and third light-emitting layers further includes a charge generation layer between the first light-emitting material layer and the second light-emitting material layer.

10. The electroluminescent display device of claim 9, wherein the first light-emitting material layer of the first and third light-emitting layers is a red light-emitting material layer, the first light-emitting material layer of the second light-emitting layer is a green light-emitting material layer, and the second light-emitting material layer of the first, second, and third light-emitting layers is a blue light-emitting material layer.

11. The electroluminescent display device of claim 10, further comprising a color filter on an inner surface of the second substrate,
wherein the color filter includes red, green, and blue color filters disposed in the first, second, and third sub-pixels, respectively.

12. The electroluminescent display device of claim 8, wherein the pixel includes one first sub-pixel, two second sub-pixels, and one third sub-pixel, and
wherein the first sub-pixel and the third sub-pixels are arranged adjacent to each other along a second direction perpendicular to the first direction, the first sub-pixel and one of the second sub-pixels are arranged adjacent to each other along the first direction, and the third sub-pixel and the other of the second sub-pixels are arranged adjacent to each other along the first direction.

13. The electroluminescent display device of claim 12, wherein the first light-emitting layer of the first sub-pixel and the third light-emitting layer of the third sub-pixel adjacent to each other along the second direction are connected to each other and formed as one body, and the second light-emitting layers of the second sub-pixels adjacent to each other along the second direction are connected to each other and formed as one body.

14. The electroluminescent display device of claim 1, wherein the bank includes a hydrophobic bank.

15. The electroluminescent display device of claim 14, wherein the bank further includes a hydrophilic bank between adjacent sub-pixels along a second direction perpendicular to the first direction.

16. The electroluminescent display device of claim 14, wherein the hydrophilic bank and the hydrophobic bank are formed as one body.

17. The electroluminescent display device of claim 1, further comprising at least one thin film transistor between the substrate and the first electrode, and the first electrode is connected to the at least one thin film transistor.

18. The electroluminescent display device of claim 1, wherein the first portion has a right-angled trapezoidal shape, and the second portion has a rectangular shape.

19. The electroluminescent display device of claim 18, wherein the first portion includes a first base of a first width and a second base of a second width smaller than the first width, and the second portion has short sides of the second width.

* * * * *